United States Patent
Lerche

(10) Patent No.: US 9,431,976 B2
(45) Date of Patent: Aug. 30, 2016

(54) TRANSIMPEDANCE AMPLIFIER

(71) Applicant: Thermo Fisher Scientific (Bremen) GmbH, Bremen (DE)

(72) Inventor: Heinz Lerche, Stuhr (DE)

(73) Assignee: Thermo Fisher Scientific (Bremen) GmbH, Bremen (DE)

( * ) Notice: Subject to any disclaimer, the term of this patent is extended or adjusted under 35 U.S.C. 154(b) by 0 days.

(21) Appl. No.: 14/730,738

(22) Filed: Jun. 4, 2015

(65) Prior Publication Data

US 2015/0357981 A1    Dec. 10, 2015

(30) Foreign Application Priority Data

Jun. 5, 2014    (GB) .................................. 1410004.4

(51) Int. Cl.
*H03F 3/45*    (2006.01)
*H01J 49/02*    (2006.01)

(52) U.S. Cl.
CPC ......... *H03F 3/45071* (2013.01); *H01J 49/022* (2013.01); *H03F 2200/129* (2013.01); *H03F 2200/135* (2013.01); *H03F 2200/144* (2013.01); *H03F 2203/45222* (2013.01); *H03F 2203/45288* (2013.01)

(58) Field of Classification Search
CPC .... H01J 49/022; H03F 3/70; H03F 3/45071; H03F 2200/129; H03F 2200/135; H03F 2200/45222; H03F 2203/45288; H03F 2200/144; H01C 1/06; G01R 29/24
See application file for complete search history.

(56) References Cited

U.S. PATENT DOCUMENTS

| | | | | |
|---|---|---|---|---|
| 5,030,925 A | * | 7/1991 | Taylor | H03F 3/082 250/214 A |
| 6,317,024 B1 | * | 11/2001 | Orii | H01C 1/06 338/233 |
| 7,262,655 B2 | * | 8/2007 | Mijuskovic | H03F 3/08 330/282 |
| 2008/0205906 A1 | * | 8/2008 | Murata | H03F 3/08 398/208 |
| 2014/0132342 A1 | * | 5/2014 | Sobukawa | H03F 1/34 330/99 |

FOREIGN PATENT DOCUMENTS

| | | |
|---|---|---|
| DE | 678720 C | 7/1939 |
| GB | 0298703 A | 10/1928 |
| GB | 2393865 | 10/2005 |
| GB | 2424330 A | 9/2006 |
| WO | WO 2013/098597 A1 | 7/2013 |

* cited by examiner

*Primary Examiner* — Wyatt Stoffa
(74) *Attorney, Agent, or Firm* — David A. Schell

(57) ABSTRACT

A transimpedance amplifier includes a resistor assembly coupled between an output of the transimpedance amplifier and an input of the transimpedance amplifier, and a voltage source for applying a first voltage to a first conductive compensation element of the resistor assembly and a second voltage to a second conductive compensation element of the resistor assembly. The first voltage and the second voltage are each derived from the output voltage, $V_{out}$, of the transimpedance amplifier. The first voltage is a first proportion of $V_{out}$ and the second voltage is a second proportion of $V_{out}$. The voltage source includes a voltage controller for adjusting at least one of the first proportion and/or the second proportion.

29 Claims, 10 Drawing Sheets

TRANSIMPEDANCE AMPLIFIER

TECHNICAL FIELD

The present disclosure relates to a transimpedance amplifier, a method for configuring a transimpedance amplifier and a method for using a transimpedance amplifier.

BACKGROUND

There is a number of applications where it is necessary to measure currents across a high dynamic range with a good signal to noise ratio. For example, in isotope-ratio mass spectrometry, there is a need for an amplifier with the ability to respond accurately to signals with a high dynamic range and measure isotopic abundance with high precision. In such an application, a particularly demanding requirement occurs quite frequently. The amplifier must first measure a relatively large ion-current. This input signal fades out quickly and a few seconds later a relatively very weak second ion-current occurs (caused by a small isotopic abundance). The amplifier must be able to handle both the fast fade-out of the first signal and make a precise measurement of the relatively weak current signal.

In order to achieve this, the amplifier needs to have a fast and precise decay to zero (i.e. to the noise floor) after measuring the first signal almost to saturation of the amplifier. The amplifier also needs to generate minimal undershoot and over-shoot of the output signal, even in the millivolt output range close to the noise floor of the amplifier.

Measurements of this type may be performed using transimpedance amplifiers, which are used to perform current to voltage conversion ('transimpedance').

FIG. 1 shows an example prior art transimpedance amplifier 100 comprising an operational amplifier 10 and a feedback resistor R that is connected between the inverting input of the operational amplifier 10 and the output of the operational amplifier 10. In an ideal case, the transimpedance amplifier will amplify the input current I and convert it into a low impedance output voltage V in accordance with the equation:

$$V = -I*R$$

Transimpedance amplifiers that are configured to operate with small or very small input currents I in the pico- to femto-ampere range typically operate with a large feedback resistor R in the range of 1E9 to 1E14 ohms.

When a very small input current I is being measured, a very small current flows through the feedback resistor R and produces a small voltage drop across the feedback resistor R, driving the negative input terminal of the operational amplifier 10 so that the output voltage V changes as a response to the input signal I. The output voltage V of the amplifier 100 is compensating the input voltage by the feedback resistor and drives the input terminal of the operational amplifier 10 to zero volts. An ideal amplifier will always preserve zero volts between its two input terminals.

In practice, however, a bias current is always superimposed on the measured input current I. If the bias current is constant an also constant voltage drop is present. For example, a bias current of 1 fA will cause a voltage drop of 10 mV when using a feedback resistor R of 10 TΩ. Ideally, this additional voltage drop should be as small as possible, which requires the selection of an operational amplifier 10 with a very small bias current.

When designing a transimpedance amplifier of this type, careful attention should be paid to its stability because extremely high impedance resistors exhibit a self-capacitance that tends to cause the amplifier to oscillate. In practice, it is known to limit the theoretical bandwidth of the amplifier by shunting the feedback resistor R with a small capacitor C in the range of 0.05-0.1 pF. The time-constant T of the feedback resistor R itself is then equal to T=R*C, which is approximately 0.5 to 1 second for very high value feedback resistors.

Where the amplifier 10 is required to achieve high precision measurement, for example around 1 ppm (part-per-million) in isotope-ratio mass spectrometry, the inherent exponential decay of the feedback resistor R at this precision equals a delay D of:

$$D = \ln(1E+6)*T = 13.8*T = \text{approximately 7 to 14 s.}$$

A delay of this size might be reasonable for practical experiments, but due to the nature of extremely high impedance resistors and the added capacitor, such ideal parts in practice are not achievable. Most discrete electronic capacitors have a solid dielectric inside and non-ideal behaviors of the dielectric, such as finite insulation resistance (leakage current) and polarization effects (dielectric absorption), exclude the use of those capacitors.

The properties of extremely high impedance resistors in the tera-ohm range also differ considerably from ideal resistors. Temperature coefficient, voltage coefficient, self-capacitance and self-inductance have to be taken into account. The first two properties may be optimized by good material selection during manufacture and the last property may effectively be ignored due to the low speed of operation. However, self-capacitance should be treated very carefully in order to build a working amplifier.

One known technique for trying to compensate for the drawbacks associated with an ultra-high impedance resistor in a transimpedance amplifier is described, for example, in GB2393865B, wherein a lower value resistor is put in series with the ultra-high value resistor. The current to be measured is fed into the much lower impedance resistor and produces a compensation voltage drop to improve performance of current amplifiers.

However, this solution assumes a nearly ideal resistor model with only stray capacitance.

FIG. 2 shows the construction of an example ultra-high value resistor 200. The resistor 200 is constructed by coiling a high impedance resistive coating 220 around an insulative ceramic cylinder 210. The resistive coating 220 acts as the resistive element of the resistor 200 and the more helical spirals that are made, the more resistance the component exhibits. In order to protect the resistive element 220 from mechanical and/or chemical interference, the resistive element 220 is hermetically sealed with a lacquer coating 230, which may have a thickness of about 0.75 mm thickness, for example a thickness of between 0.5 mm-1 mm, such as 0.5 mm, 0.6 mm, 0.75 mm, 0.8 mm or 1 mm.

Theoretically, the lacquer coating 230 itself also acts as a resistive part because every layer has a finite resistance. Furthermore, because the layer is a good insulator, it also acts as a solid dielectric that can be polarized and that suffers from dielectric absorption. Therefore, the lacquer coating 230 may be treated as a distributed mesh of resistors and capacitors along the length of an ideal resistive component.

When measuring a small current, the distributed mesh of RC-networks acts as a shunt impedance. The value of the shunt impedance for ultrahigh value resistors can be very high, which results in a long charge-up duration of current being superimposed on the real current to be measured. Furthermore, the stored charges in the mesh will exhibit a fade out current even when the current to be measured is physically removed. In addition to this, electric fields surrounding the resistor will introduce charges in the mesh of RC-networks in the resistor coating. The effects together introduce a first exponential time constant to the transimpedance amplifier circuit, corrupting the slope of the measured rise and fall times and generally distorting amplifier response.

GB2424330A describes a technique for trying to overcome these problems by controlling the electric fields of the resistor. A metal cylinder is provided to surround the feedback resistor of a transimpedance amplifier and act as a capacitor that has air isolation and is held at a voltage equal to a fraction of the amplifier output voltage. Through this arrangement the sensitive feedback resistor is shielded and noise from external sources of electrical radiation and fields cannot disturb the signal. The transimpedance amplifier includes multiple operational amplifiers that are configured to improve gain and provide filter networks to achieve a minimal rise time of the amplifier.

In an alternative technique, U.S. Pat. No. 7,262,655B2 describes a transimpedance amplifier arrangement with a feedback resistor of a relatively low value of about 100KΩ. The feedback resistor is made up from a series of smaller value chip resistors. Each chip resistor is provided in close proximity with a low impedance counterpart in a parallel electrical resistor ladder, which is intended to compensate for the stray capacitance of the piecewise varying electrical field of the chip resistors.

However, the solutions suggested in GB2424330A and U.S. Pat. No. 7,262,655B2 assume that the feedback resistor is a constant linear device, which, in practice, is not the case for ultra-high value resistors. As a consequence, when an ultra-high value resistor is being used, the precision and repeatability of amplifier performance may be degraded.

Furthermore, with reference to the ultra-high value resistor 200 shown in FIG. 2, the insulative core 210 of the resistor 200 also acts as a dielectric and an axial electric field along the resistor body may cause a dielectric charge and therefore also dielectric absorption in the insulative core 210. Likewise, the insulative element 230 that surrounds the resistive element 220 may also suffer from dielectric absorption. This dielectric absorption introduces a second time constant, which results in a further unwanted delay and/or distortion when measuring very small currents (i.e. femtoampere). In some cases, the second time constant can be so long that the output signal will effectively never reach the correct level (for example, OV) after a change in the input.

FIG. 3 shows an example response at the output of a transimpedance amplifier to a step change to a zero level signal at the input. This response demonstrates the effect of the first time constant, $\tau_1$, and the second time constant, $\tau_2$. The curve labelled $\tau_1$ shows the effect of $\tau_1$ when the feedback resistor is assumed to be a constant, linear device (i.e. the effect of $\tau_2$ is ignored). The curved labelled $\tau_2$ shows the real response of an amplifier with an ultra-high impedance feedback resistor. As can be seen, the dielectric absorption which introduced the second time constant has delayed and distorted the amplifier response, such that the amplifier output may effectively never reach the correct level.

FIG. 4 shows a further example amplifier response to a step change to a zero level signal at the input that may be typical of prior art transimpedance amplifiers. As can be seen, the amplifier output initially decreases quickly, because the amplifier is optimized to minimize $\tau_1$ and, therefore, have a fast initial response. However, after the fast initial response, a gradual creep in the output towards the final output level can be observed. This creep is caused by $\tau_2$, and causes a delay and distortion in the amplifier response, such that the amplifier output may effectively never reach the correct level.

These effects are highly significant for ultrahigh value resistors (i.e. 1 TΩ and above). Therefore, the solutions described in GB2424330A and U.S. Pat. No. 7,262,655B2 may be ineffectual for the measurement of very small currents using an ultrahigh impedance resistor.

SUMMARY OF INVENTION

In a first aspect of the present disclosure, there is provided a transimpedance amplifier comprising: a resistor assembly coupled between an output of the transimpedance amplifier and an input of the transimpedance amplifier, the resistor assembly comprising: a resistor having a longitudinal length, resistor comprising: a resistive element; and an insulator surrounding the resistive element. The resistor assembly further comprises a plurality of conductive compensation elements each at least partially surrounding the insulator along at least part of the longitudinal length of the resistor. The transimpedance amplifier further comprises a voltage source for applying a first voltage to a first conductive compensation element of the plurality of conductive compensation elements and a second voltage to a second conductive compensation element of the plurality of conductive compensation elements, wherein: the first voltage and the second voltage are each derived from the output voltage, $V_{out}$, of the transimpedance amplifier, the first voltage being a first proportion of $V_{out}$ and the second voltage being a second proportion of $V_{out}$ and wherein the voltage source comprises: a voltage controller for adjusting at least one of the first proportion and/or the second proportion.

The transimpedance amplifier may be an isotope-ratio mass spectrometry transimpedance amplifier, i.e. the amplifier may be suitable for use in isotope-ratio mass spectrometry. The transimpedance amplifier may have a relatively fast response to changes in the current input to the amplifier. For example, the output voltage may settle to a level in a relatively short period after a change in the input current (for example, within 8 seconds, or 6.5, or 6, or 5, or 4 seconds of the change in the input current). The transimpedance amplifier may also settle to the output level without any undershoot or overshoot, minimising settling time for the output of the transimpedance amplifier. These characteristics may be useful in isotope-ratio mass spectrometry where first and second input currents are to be measured, wherein after the first relatively large input current has faded, the second relatively small input current (for example, in the order of pico-amps (pA) and less, for example 400 pA (4E-10 A), or 100 pA (1E-10 A), or 60 pA (6E-11 A), or 2 pA (2E-12 A), or 20 fA (2E-14 A) or 1 fA (1E-15 A) etc) follows some time later, or in any other applications where a relatively fast response to changes in input current and/or an ability to measure small input currents is required.

The transimpedance amplifier may have a feedback resistor that is an ultra-high value resistor (particularly where it is an isotope ratio mass spectrometry amplifier), which may have a resistance of approximately 1 TΩ (i.e. 1E12Ω) or more. For example, it may have a resistance of 1 TΩ, or 1-10 TΩ, such as 3 TΩ, or 1-100 TΩ, such as 10 TΩ, 20 TΩ, 25 TΩ, 40 TΩ, 60 TΩ, 70 TΩ, 90 TΩ or 100 TΩ.

A number of imperfect resistor characteristics that may be negligible for resistors with smaller values can become significant for resistors with ultrahigh values. Those characteristics include non-linear axial and radial capacitance and/or dielectric absorption along the length of the resistor, which can have a significant impact on the responsiveness and accuracy of transimpedance amplifiers using ultrahigh value feedback resistors. In some applications, for example isotope-ratio mass spectrometry, the speed and accuracy with which the transimpedance amplifier voltage output responds to a change in the current input is important in order to perform isotope measurements.

Furthermore, in practice, ultrahigh value resistors are not constant linear devices. Due to manufacturing tolerances, the insulative element that surrounds the resistive element is likely to have variations in its thickness, for example of approximately +/−0.2 mm. This causes an inhomogeneous distribution of the radial and axial electric fields in the resistor, which affects the distributed mesh of RC-networks that is derived from the insulative element.

The plurality of conductive compensation elements, which may be of any suitable cross-sectional size and shape and any suitable longitudinal length, enable the application of an external electric field to the resistor in order to compensate for the axial and radial dielectric absorption characteristics of the resistor. Different voltages may be applied to each compensation element and, consequently, different external electric fields applied. This enables differential, non-linear compensation along the longitudinal length of the resistor, which enables compensation of the non-linear distribution of axial and radial capacitance and/or dielectric absorption along the longitudinal length of the resistor.

The voltages applied to the conductive compensation elements may each be different from each other, thus applying different external electric fields to the resistor along its longitudinal length. The voltages applied to the conductive compensation elements may therefore be selected such that a greater external electric field is applied to the resistor at a location where that is required to compensate for the degree of axial and/or radial capacitance and/or dielectric absorption experienced there, and a lesser external electric field applied to the resistor at a location where that is required to compensate for the degree of axial and/or radial capacitance and/or dielectric absorption experienced there. Thus, the unique, non-linear characteristics of each individual feedback resistor may be compensated for on a resistor by resistor basis, resulting in more accurate compensation for each unique resistor.

Whilst the first and second voltages are likely to be different from each other, they may alternatively be the same, for example where it is desired that the first and second conductive compensation elements each produce electric fields of the same magnitude in order to compensate for the nonlinearities of the feedback resistor.

Compensating for the axial and radial capacitance and/or dielectric absorption in this way improves the speed with which the output of the transimpedance amplifier responds to a change in a current input to the transimpedance amplifier. Furthermore, the output of the transimpedance amplifier may settle to its output level without overshoot or undershoot, which can improve the accuracy of measurements made using the transimpedance amplifier. This may be useful in a number of different applications where a rapid return to a baseline, zero output level without overshoot or undershoot in response to the input current going to zero is desirable. For example, in isotope-ratio mass spectrometry, it is desirable that a second, small current, which follows soon after a first, larger current, can be accurately measured using the transimpedance amplifier. Therefore, the conductive compensation elements may be used to minimize overshoot and undershoot of the output level, which is of particular benefit in applications such as isotope-ratio mass spectrometry where it may be desirable to minimize the settling time of the output of the amplifier.

The first voltage and second voltage applied to the first and second conductive compensation elements is derived from output voltage, $V_{OUT}$, of the transimpedance amplifier, such that the first voltage is a first proportion of $V_{OUT}$ (for example, $0.2V_{our}$) and the second voltage is a second proportion of $V_{OUT}$ (for example, $0.6V_{OUT}$). The voltage source may comprise any electrical component or collection of components that can derive the first and second voltages from $V_{OUT}$ and apply them to the first and second conductive compensation elements.

The first and/or second proportion may be set to any proportion of the output of the transimpedance amplifier, for example they may be set to any value between (and inclusive of) 0-1 times the output of the amplifier (for example, 0.3 time the output of the amplifier, or 0.7 times the output of the amplifier). Alternatively, the first and/or second proportion may be set to a value greater than the output of the amplifier (such as $1.5V_{OUT}$, or $4V_{OUT}$ etc), for example where the voltage source has an active component, such as an amplifier. Alternatively, they may be set to a proportion of the output that is less than 0, for example $-0.4V_{OUT}$, or $-1.6V_{OUT}$ etc.

The voltage source may comprise at least one voltage divider (or potential divider) at the output of the transimpedance amplifier, wherein at least one of the first voltage and/or the second voltage is taken from the at least one voltage divider. The voltage divider may comprise any number of resistors, each of which may have any resistor value suitable for deriving the desired first proportion and/or second proportion.

In this case the voltage controller may comprise at least one variable resistor arranged in the at least one voltage divider such that the at least one first proportion and/or second proportion that is set by the voltage divider is adjustable using the at least one variable resistor.

Additionally, or alternatively, the voltage source may comprise a digital circuit configured to digitise the output of the transimpedance amplifier and set at least one of the first voltage and/or the second voltage as a function of the digitised output of the transimpedance amplifier.

In this case, the digital circuit may comprise an adjustment input for adjusting at least one of the first proportion and/or the second proportion, wherein the voltage controller comprises the adjustment input of the digital circuit. The adjustment input may comprise a biasing voltage input to the digital circuit and/or a programming interface to the digital circuit.

The voltage controller may comprise an adjustment terminal configured such that at least one of the first proportion and/or the second proportion is adjustable by application of an adjustment voltage (for example, Vx) to the adjustment terminal. For example, the voltage source may comprise at least one voltage divider for setting the first and/or second proportions. The adjustment terminal may then be arranged such that the adjustment voltage is applied to the voltage divider in such a way that a change in the voltage applied to the adjustment terminal changes the biasing of the voltage divider and, consequently, changes the first proportion and/or the second proportion.

Furthermore, if after initial configuration the transimpedance amplifier is housed within a vacuum chamber, which may be useful for protection from humidity and charged particles that could be created from air by cosmic radiation, the voltage applied to the conductive compensation elements may no longer be adjusted using at least one variable resistor in the voltage divider and/or using the adjustment input of the digital circuit. Any variations in the voltages applied to the conductive compensation elements from the initial configuration, for example from component aging or temperature variations, throughout the life of the transimpedance may then be compensated for by application of a voltage to the adjustment terminal. Even if the transimpedance amplifier is not housed within a vacuum chamber, the adjustment terminal may still be provided such that the voltage applied to the at least one conductive compensation element may be adjusted by applying a voltage to the adjustment terminal.

The voltage controller may be configured for adjusting the first proportion and the second proportion independently from each other. For example, the voltage source may comprise two voltage dividers, the first setting the first proportion and the second setting the second proportion. Each of the voltage dividers may comprise a variable resistor (and/or an adjustment terminal), such that the two variable resistors may be independently adjusted to adjust the first proportion independently from the second proportion and vice-versa.

Alternatively, the voltage source may comprise one voltage divider for setting the first proportion and a digital circuit for setting the second proportion, wherein the voltage controller comprises a variable resistor in the voltage divider and an adjustment input in the digital circuit. The first and second proportions may thereby be varied independently of each other.

The shape of the resistive element may be tubular, wherein the resistive element may be a hollow or solid tube and the cross-sectional shape may be any suitable shape, preferably circular or near-circular, or it may be formed as a helical shape, for example coiled around an insulative core, or any other suitable arrangement.

The longitudinal length of the resistor is not the length of the resistive path of the resistive element (for example, the helical path along a helical resistive element), but is the linear length of the resistor. For example, the longitudinal length of the resistor may be the length along the longitudinal axis of the resistor, or the length from the input to the resistor to the output. If the resistor is very short, but with a very large diameter, the longitudinal length would still be the length along the longitudinal axis of the resistive element and would not be the diameter of the resistive element.

The length of each of the plurality of conductive compensation elements may be substantially equal to or greater than half the outer diameter of the resistor. For example, they may be 40% of the outer diameter of the resistor, or 50% of the outer diameter of the resistor, or 60% of the outer diameter of the resistor, or 80% of the outer diameter of the resistor etc. In this way, non-linearities in the resistor may be accurately compensated using the conductive compensation elements without overcomplicating the resistor assembly.

Each of the plurality of conductive compensation elements may be arranged to occupy different positions along the longitudinal length of the resistor, such that none of the compensation elements overlap each other along the length of the resistor.

The plurality of conductive compensation elements may have a hollow tubular shape with any cross-sectional shape suitable for applying compensating external electric fields to the resistor. Preferably, the cross-sectional shape of the plurality of conductive compensation elements is the same for each element. Preferably the cross-sectional shape of the plurality of conductive compensation elements matches the cross-sectional shape of the resistor, which in preferred forms may be circular. The length of each conductive compensation element may also be the same or different. Each of the plurality of conductive compensation elements may, or may not, be arranged fully to surround the insulator of the resistive along at least part of the longitudinal length of the resistive element.

The inner diameter of each of the plurality of conductive compensation elements may be substantially twice the outer diameter of the resistor (for example, the outer diameter of the insulative material). For example, they may be 1.8 times great than the outer diameter of the resistor, or 2 times greater than the outer diameter of the resistor, or 2.1 times greater than the outer diameter of the resistor, or 2.4 times greater than the outer diameter of the resistor etc. In this way, the voltage application required for the conductive compensation elements may be kept at a manageable level (for example, it may be derived from the output of a transimpedance amplifier) whilst still enabling accurate compensation of non-linearities in the resistor.

The insulative layer surrounding the resistive element of the resistor may be formed from any insulative material, for example it may comprise a lacquer coating formed on the resistive element. The lacquer coating may be of any suitable thickness and because the thickness of the lacquer coating may vary along the axial length of the resistor due to manufacturing tolerances, this may cause at least some of the nonlinearities in the capacitance and dielectric absorption of the resistor along the length of the resistor. These may be compensated for using the conductive compensation elements.

Preferably the plurality of conductive compensation elements comprises three conductive compensation elements. This may enable the nonlinearities of the resistor to be compensated for with a greater degree of accuracy along the length of the resistor. The resistor may also comprise more than three conductive compensation elements, even further improving the accuracy with which the nonlinearities may be compensated for.

The resistor may comprise an insulative core. Due to manufacturing tolerances, the insulative core may have variations in its thickness and/or material properties. This may cause a non-linear distribution of the radial and axial electric fields and dielectric absorption in the resistor. Again, the conductive compensation elements may be used to compensate for these non-linearities in order to improve the performance of a transimpedance amplifier, as explained above.

The output of the transimpedance amplifier may be a voltage output and the input of the transimpedance amplifier may be a current input.

The resistor assembly may be housed within a vacuum enclosure such that at least the resistor assembly is surrounded by the enclosure. One or more other elements of the transimpedance amplifier may also be housed within the vacuum chamber, for example the voltage source etc. Alternatively, the entire transimpedance amplifier may be housed within the vacuum chamber. The vacuum chamber may be useful for protection from humidity and charged particles that could be created from air by cosmic radiation.

The present disclosure also provides an isotope-ratio mass spectrometry transimpedance amplifier comprising: a resistor assembly coupled between an output of the transimpedance amplifier and an input of the transimpedance amplifier, the resistor assembly comprising: a resistor having a longitudinal length, the resistor comprising: a resistive element; and an insulator surrounding the resistive element; a plurality of conductive compensation elements each at least partially surrounding the insulator along at least part of the longitudinal length of the resistor; and a variable voltage source for applying a first voltage to a first conductive compensation element of the plurality of conductive compensation elements and a second voltage to a second conductive compensation element of the plurality of conductive compensation elements, the second conductive compensation element preferably being adjacent to the first conductive compensation element, wherein: the first voltage and the second voltages each being derived from the output of the transimpedance amplifier, and wherein the first voltage is greater than the second voltage and the difference between the output voltage of the transimpedance amplifier and first voltage is different from the difference between the first voltage and the second voltage.

The present disclosure also provides an isotope-ratio mass spectrometry transimpedance amplifier comprising: a resistor assembly coupled between an output of the transimpedance amplifier and an input of the transimpedance amplifier, the resistor assembly comprising: a resistor having a longitudinal length, the resistor comprising: a resistive element; and an insulator surrounding the resistive element; at least three conductive compensation elements each at least partially surrounding the insulator along at least part of the longitudinal length of the resistor; and a voltage source for applying a first voltage to a first conductive compensation element of the plurality of conductive compensation elements, a second voltage to a second conductive compensation element of the plurality of conductive compensation elements and a third voltage to a third conductive compensation element of the plurality of conductive compensation elements, wherein: the first conductive compensation element is adjacent to the second conductive compensation element along the longitudinal length of the resistor; the second conductive compensation element is adjacent to the third conductive compensation element along the longitudinal length of the resistor; and the second conductive compensation element is positioned between the first conductive compensation element and the third conductive compensation element along the longitudinal length of the resistor; and wherein the difference between the first voltage and the second voltage is different from the difference between the second voltage and the third voltage.

The present disclosure also provides a mass spectrometer comprising any of the above described transimpedance amplifiers.

The present disclosure also provides a method of configuring the above described transimpedance amplifier, comprising applying a step current to the input of the transimpedance amplifier; and setting at least one of a first voltage applied to a first conductive compensation element and/or a second voltage applied to the second compensation element.

Setting of the first and/or second voltages may be performed by iterative adjustment of the first proportion and/or the second proportion, for example where the first proportion may be adjusted and the step current input step repeated to determine the effect on the output of the transimpedance amplifier caused by the adjustment of the first proportion. This process may be repeated multiple times until the output of the transimpedance amplifier performs in a desired manner. Likewise, this iterative process may also be performed when setting the second voltage. Furthermore, the iterative process of adjustment and re-testing amplifier response to a step current may be carried out by adjusting the first and second proportions in turn repetitively (i.e. after setting the second proportion, returning to iterative adjustment of the first proportion, then returning to iterative adjustment of the second proportion, then returning to iterative adjustment of the first proportion etc.) or in tandem (i.e. iterative adjustment of both the first and second proportions at the same time).

The first voltage and/or the second voltage may be set to values that minimise overshoot and undershoot of a voltage at the output of the transimpedance amplifier in response to the step current at the first input of the transimpedance amplifier. In this way, the settling time of the output of the amplifier may be minimised, which may be particularly beneficial in applications such as isotope-ratio mass spectrometry. Of importance to isotope ratio measurements, advantageously the time for the transimpedance amplifier to settle to a final output voltage may be minimised, and notably this is not equivalent to obtaining the fastest time constant for the amplifier decay characteristic.

Whilst the first voltage applied to the first conductive compensation element (which is the compensation element closest to the input of the transimpedance amplifier) may have an effect on the overshoot and undershoot of the voltage at the output of the amplifier, it may particularly be adjusted to achieve a desired time constant for the transimpedance amplifier in response to the step change in current. For example, a time constant of approximately 0.5-1.5 seconds (equalling 0.32-0.11 Hz) may be desired, such as 0.4 seconds, or 0.7 seconds, or 1 second, or 1.5 seconds, or 1.6 seconds etc.

The second voltage applied to the second conductive compensation element (which is the compensation element second closest to the input of the transimpedance amplifier) may have a significant influence on the overshoot and undershoot of the amplifier, and may therefore be set with particular consideration to minimising overshoot and undershoot of a voltage at the output of the transimpedance amplifier in response to a step current at the first input of the transimpedance amplifier.

The first and/or second proportions may be adjusted using the voltage controller, or by any other suitable means, for example by changing the values of the resistors in a voltage divider in the voltage source etc.

Where the resistor assembly has a third conductive compensation element that is the compensation element closest to the output of the transimpedance amplifier, a third voltage applied to the third conductive compensation element may be set to a level to minimise overshoot and undershoot of a voltage at the output of the transimpedance amplifier in response to a step current at the first input of the transimpedance amplifier and to boost a rise time of the step current at the first input of the transimpedance amplifier.

The transimpedance amplifier may in this way, or by any other suitable set-up technique, be configured to have desirable characteristics of a fast response to changes in the input current with no or little undershoot or overshoot in its output.

In contrast to prior art methods, preferably where the transimpedance amplifier is for use in isotope-ratio mass spectrometry, the chosen set-up technique is performed so as to ensure that the time-constant of any creep in output of the amplifier towards a final output level is minimised, even where this results in a longer initial signal decay.

The configuration method may further comprise adjusting a voltage applied to an adjustment terminal of the transimpedance amplifier (the adjustment terminal being arranged such that a voltage applied to the adjustment terminal adjusts at least one of the voltages applied to the conductive compensation elements) in order to adjust at least one of the first proportion and/or the second proportion. Adjustment of the voltage applied to at least one of the conductive compensation elements by adjusting the first and/or second proportions enables the characteristics of the amplifier to be tuned and adjusted throughout the lifetime of the amplifier even when other techniques for adjusting the voltage applied to the conductive compensation elements (for example, variable resistors at the output of the amplifier) are not available (for example by virtue of the amplifier being housed within a vacuum chamber).

The present disclosure also provides a method of converting a current to a voltage using a transimpedance amplifier that comprises: a resistor assembly coupled between an output of the transimpedance amplifier and an input of the transimpedance amplifier, the resistor assembly comprising: a resistor having a longitudinal length, the resistor comprising: a resistive element; and an insulator surrounding the resistive element. The resistor assembly further comprises a plurality of conductive compensation elements each at least partially surrounding the insulator along at least part of the longitudinal length of the resistor. The transimpedance amplifier further comprises a voltage source for applying a first voltage to a first conductive compensation element of the plurality of conductive compensation elements and a second voltage to a second conductive compensation element of the plurality of conductive compensation elements, wherein: the first voltage and the second voltage are each derived from the output of the transimpedance amplifier. The method comprises: applying the current to be converted to the input of the transimpedance amplifier such that a corresponding voltage is output at the output of the transimpedance amplifier, and applying the first voltage to the first conductive compensation element of the plurality of conductive compensation elements and the second voltage to a second conductive compensation element of the plurality of conductive compensation elements, wherein the first voltage and/or the second voltage have a magnitude(s) set to minimise the overshoot and undershoot of the output of the transimpedance amplifier in response to a change in the input current.

Minimising the overshoot and undershoot of the output should minimise the settling time of the amplifier, which, even where the minimisation results in a longer initial signal decay, may be particularly beneficial for applications such as isotope-ratio mass spectrometry.

The present disclosure also provides a method for performing mass spectrometry comprising: generating ions in an ion source; separating the ions according to their mass-to-charge ratio in a mass analyser; admitting the ions to a collector to generate an electrical current; and converting the electrical current to a voltage according to the above disclosed method.

In a first aspect of the present disclosure, there is provided a resistor assembly for use in an isotope-ratio mass spectrometry transimpedance amplifier, the resistor assembly comprising: a resistor having a longitudinal length, the resistor comprising: a resistive element; and an insulator surrounding the resistive element; the resistor assembly further comprising a plurality of conductive compensation elements each at least partially surrounding the insulator along at least part of the longitudinal length of the r; wherein the plurality of conductive compensation elements are electrically isolated from each other such that a first voltage of non-zero magnitude (for example, a voltage that of greater potential or lesser potential than ground) may be applied to a first conductive compensation element of the plurality of conductive compensation elements and a second non-zero voltage (for example, a voltage that of greater potential or lesser potential than ground) may be applied to a second conductive compensation element.

In a further aspect of the present disclosure, there is provided a resistor assembly comprising a resistor with an impedance in excess of $10^{12}\Omega$ or in excess of $10^{13}\Omega$, the resistor having a longitudinal length and comprising: a resistive element having a length; and an insulator surrounding the resistive element; the resistor assembly further comprising a plurality of conductive compensation elements each at least partially surrounding the insulator along at least part of the longitudinal length of the resistor; wherein the plurality of conductive compensation elements are electrically isolated from each other such that a first voltage of non-zero magnitude may be applied to a first conductive compensation element of the plurality of conductive compensation elements and a second voltage may be applied to a second conductive compensation element.

In a further aspect of the present disclosure, there is provided a resistor assembly comprising an ultra-high value resistor, the ultra-high value resistor having a longitudinal length and comprising: a resistive element having a longitudinal length; and an insulator surrounding the resistive element; the resistor assembly further comprising a plurality of conductive compensation elements each at least partially surrounding the insulator along at least part of the longitudinal length of the resistor; wherein the plurality of conductive compensation elements are electrically isolated from each other such that a first voltage of non-zero magnitude may be applied to a first conductive compensation element of the plurality of conductive compensation elements and a second voltage may be applied to a second conductive compensation element.

An ultrahigh value resistor is a resistor that has an impedance greater than or equal to 1 T$\Omega$, for example 1-10 T$\Omega$, or 1-100 T$\Omega$. An ultrahigh value resistor may have a longitudinal length of at least 1 mm, for example between 1 mm and 10 cm.

In a further aspect of the present disclosure, there is provided a resistor assembly comprising a resistor having a longitudinal length, wherein the resistor comprises a tubular resistive element (hollow or solid), or coiled resistive element, the resistive element having a longitudinal length; and an insulator surrounding the resistive element; the resistor assembly further comprising a plurality of conductive compensation elements each at least partially surrounding the insulator along at least part of the longitudinal length of the resistor; wherein the plurality of conductive compensation elements are electrically isolated from each other such that a first voltage of non-zero magnitude may be applied to a first conductive compensation element of the plurality of conductive compensation elements and a second voltage may be applied to a second conductive compensation element.

A further aspect of the present disclosure is the use of an ultrahigh value resistor in an isotope-ratio mass spectrometry transimpedance amplifier.

The disclosure also provides a transimpedance amplifier comprising; the resistor assembly comprising the ultrahigh value resistor of the present disclosure, wherein the resistor assembly is coupled between an output of the transimpedance amplifier and a first input of the transimpedance amplifier.

The disclosure also provides a transimpedance amplifier comprising; a resistor assembly comprising a resistor with an impedance in excess of $10^{12}\Omega$ or in excess of $10^{13}\Omega$ in accordance with the present disclosure, wherein the resistor assembly is coupled between an output of the transimpedance amplifier and a first input of the transimpedance amplifier.

The disclosure also provides an isotope-ratio mass spectrometry transimpedance amplifier comprising a resistive assembly which has an ultrahigh value resistor.

BRIEF DESCRIPTION OF THE DRAWINGS

An ultrahigh value resistor and a transimpedance amplifier in accordance with an aspect of the present disclosure is described, by way of example only, with reference to the following drawings, in which.

DETAILED DESCRIPTION

An 'ultrahigh value resistor' may be a resistor with a resistance of approximately 1 T$\Omega$ (i.e. 1E12$\Omega$) or more. For example, it may have a resistance of 1-10 T$\Omega$, such as 1 T$\Omega$, 3 T$\Omega$, 8 T$\Omega$ or 10 T$\Omega$, or a resistance of 1-100 T$\Omega$, such as 10 T$\Omega$, 20 T$\Omega$, 25 T$\Omega$, 40 T$\Omega$, 60 T$\Omega$, 70 T$\Omega$, 90 T$\Omega$, or 100 T$\Omega$, or a resistance of 10-100 T$\Omega$, such as 50 T$\Omega$ or 100 T$\Omega$. Ultrahigh value resistors are of particular use as feedback resistors in transimpedance amplifiers used to measure very low currents, for example in the order of femto-amps (fA), i.e. 1E-15 A.

Figure 5:
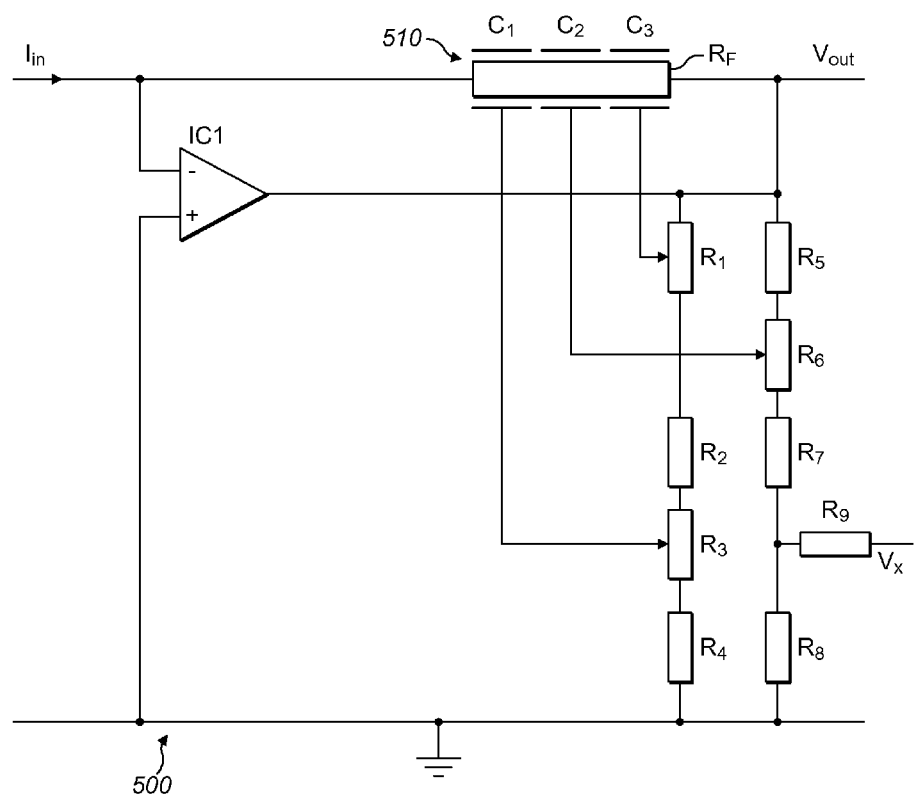
FIG. 5 shows a transimpedance amplifier with an ultrahigh value feedback resistor assembly in accordance with the present disclosure.

FIG. 5 shows a transimpedance amplifier circuit 500 comprising an operational amplifier IC1, a resistor assembly 510 comprising an ultrahigh value feedback resistor $R_F$ coupled between the output of the operational amplifier IC1 and the inverting input of the operational amplifier IC1, a first voltage divider comprising resistors R1, R2, R3 and R4 and a second voltage divider comprising R5, R6, R7 and R8. Resistors R1, R3 and R6 are variable resistors. A further resistor R9 is provided in series with an adjustment voltage Vx.

Figure 1:
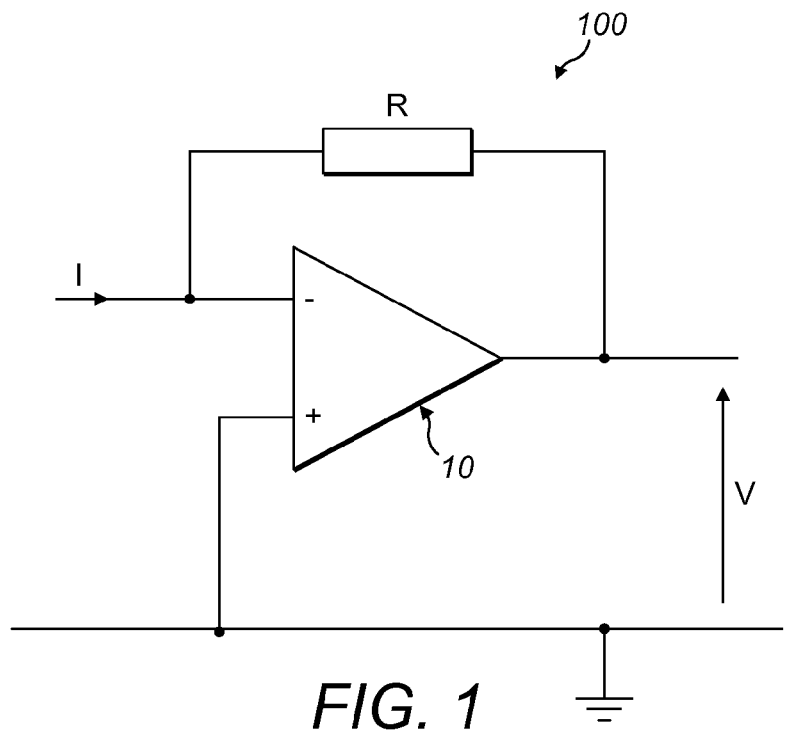
FIG. 1 shows an example transimpedance amplifier known in the prior art.
Figure 2:
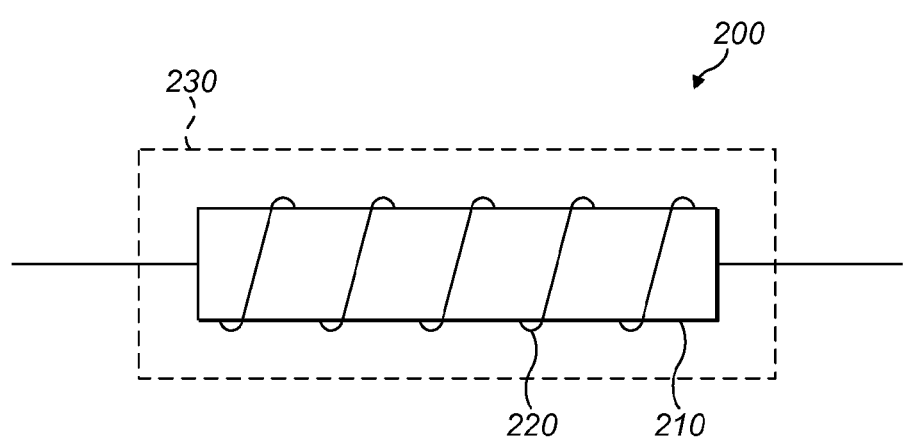
FIG. 2 shows an example construction of an ultrahigh value resistor known in the prior art.

The feedback resistor $R_F$ is constructed in the way shown in FIG. 2 and described in the 'background' section above.

Figure 6:
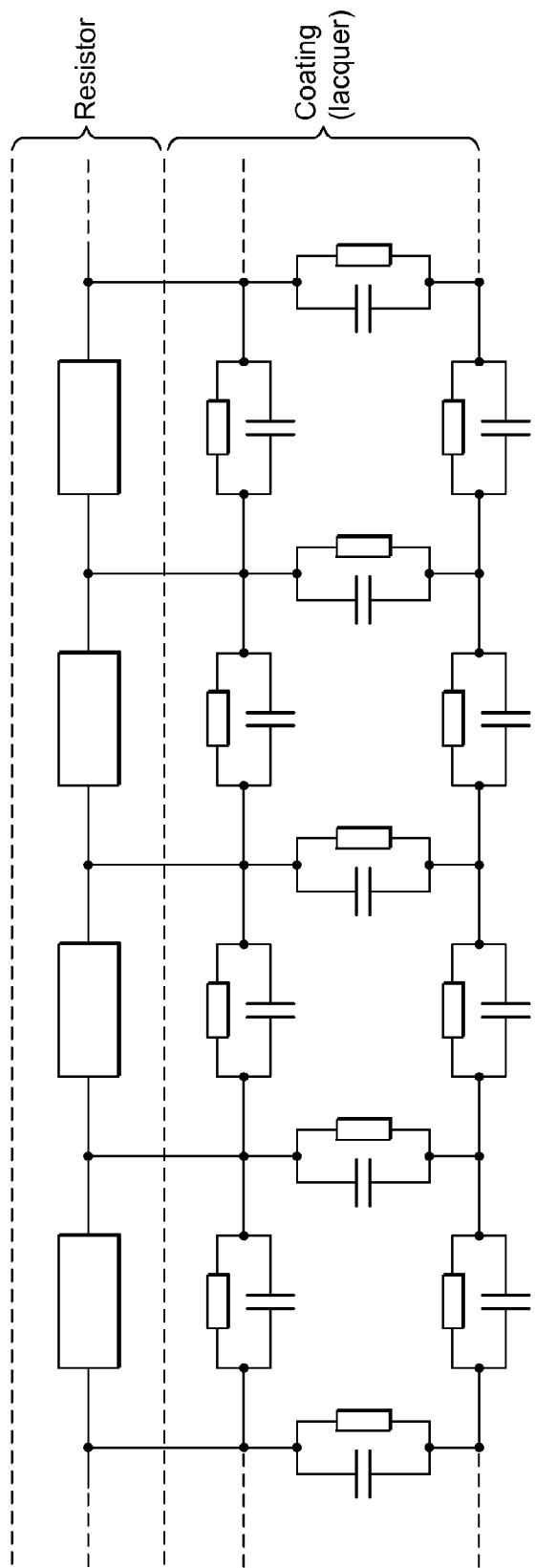
FIG. 6 shows an RC-mesh model for an ultrahigh value feedback resistor.

FIG. 6 shows a distributed mesh of resistors and capacitors in parallel with an ideal resistive element of the resistor $R_F$, representing the nature of the interaction between the resistive element and the lacquer coating. Theoretically, the network of coupled resistors and capacitors is an infinitesimally small meshed network. However, in practice, it is desirable to model the resistor with an RC mesh network of finite size, ideally finding a balance between complexity and the accuracy of modelling. Experimentation has shown that, depending on the physical dimensions of the resistor $R_F$, the feedback resistor $R_F$ may be modelled using only a small number of elements. For example, the feedback resistor $R_F$ may be modelled effectively using three to five elements along the length of the resistor, such that the ideal resistive element may be divided into three to five separate ideal resistors in series with a corresponding sized RC mesh network, as shown in FIG. 6 (where there are four ideal resistive elements with a corresponding size RC mesh network). For relatively small resistors (for example, resistors with short longitudinal length) it may be possible to model the resistor $R_F$ effectively using two separate ideal resistors in series with a corresponding sized RC mesh network.

The value of each corresponding element in the model shown in FIG. 6 representing the feedback resistor $R_F$ may be equal to each other.

However, it has been identified that inconsistencies in the manufacture of ultra-high value resistors mean that the feedback resistor $R_F$ may be modelled more accurately if the size of each element is different.

In particular, the resistive element 220 may not evenly distribute resistance along the longitudinal length of the resistor 200. Therefore, the ideal resistive components in FIG. 6 may more accurately model the resistive element 220 if each of the ideal resistive components is of a different size.

Furthermore, variations in the thickness of the lacquer coating along the length of the feedback resistor $R_F$, which may be in the order of approximately +/−0.2 mm, may cause an inhomogeneous distribution of the radial and axial electric fields and therefore varying degrees of radial and axial dielectric absorption. Likewise, variations in the size and material properties of the insulative core 210 of the feedback resistor $R_F$ may cause further non-linearities in the distribution of radial and axial electric fields and therefore varying degrees of radial and axial dielectric absorption. The distribution of the RC-network is affected by variations in the thickness of the lacquer and non-linearities in the core and can be modelled using different values for each component in the RC-network. For example, each capacitor and each resistor in the RC-network may have a different value in order to model variations in the lacquer and/or the core.

These variations along the length of the feedback resistor $R_F$ can degrade the precision and repeatability of measurements taken using the transimpedance amplifier 500. Consequently, by treating each feedback resistor $R_F$ as a unique device, variations in the manufacturing tolerances of each unique feedback resistor $R_F$ can be modelled using different values for the components in the equivalent circuit of FIG. 6. Thus, the RC-network can represent a combined treatment of all of the physical properties, such as (axial) parasitic capacitances and (axial and radial) dielectric absorption, which can then be used in establishing compensation for the physical properties in order to achieve a good response in the time domain with no distortion of the output.

This realisation has resulted in the development of a technique for compensation for the non-linearity of the feedback resistor $R_F$ using a series of conductive (for example, metal) compensation cylinders C1, C2 and C3 that surround the layer of lacquer of the feedback resistor $R_F$. Each conductive cylinder has a length along the longitudinal length of the feedback resistor $R_F$ and the length of each conductive cylinder C1, C2 and C3 may be the same or different. As shown in FIG. 5, each cylinder C1, C2 and C3 surrounds a different section of the feedback resistor $R_F$ along the length of the feedback resistor $R_F$. Also as shown in FIG. 5, the longitudinal length of the resistor $R_F$ is the linear length of the resistor, for example from the input terminal to the output terminal. It is not, for example, the resistive path length of the resistive element of the resistor $R_F$, which may be, for example, helical, making the resistive path length of the resistor longer than the longitudinal length of the resistor.

Each of the cylinders C1, C2 and C3 is formed with a gap between the cylinders C1, C2 and C3 and the lacquer layer of the feedback resistor $R_F$. Each cylinder C1, C2 and C3 is electrically isolated from the other cylinders, such that a different voltage may be applied to each cylinder C1, C2 and C3.

This configuration enables non-linear compensation along the length of the feedback resistor $R_F$ to be provided by the cylinders C1, C2 and C3. Compensation using the cylinders C1, C2 and C3 isolates the resistive element of the feedback resistor $R_F$ from electric charging of the lacquer coating which causes loading of internal capacitances and their corresponding coating resistances, which would result in a reduction of the precision achievable by the transimpedance amplifier 200. By applying a well-adjusted and calibrated external electric field from the cylinders C1, C2 and C3 such that a non-linear electric field is established along the longitudinal length of the feedback resistor $R_F$, compensation of axial and radial parasitic capacitances and axial and radial dielectric absorption, which are all nonlinear with position along the length of the feedback resistor $R_F$ (as a consequence of the manufacturing inconsistencies explained above), may be achieved along the length of the feedback resistor $R_F$.

By neutralising all of these elements, an improved response in the time domain may be achieved for the transimpedance amplifier 500, without any compromise in distortion. Thus, a more accurate compensation scheme for ultrahigh value resistors is realised, and a very high dynamic precision transimpedance amplifier 500 for measuring very low currents achieved.

Figure 3:
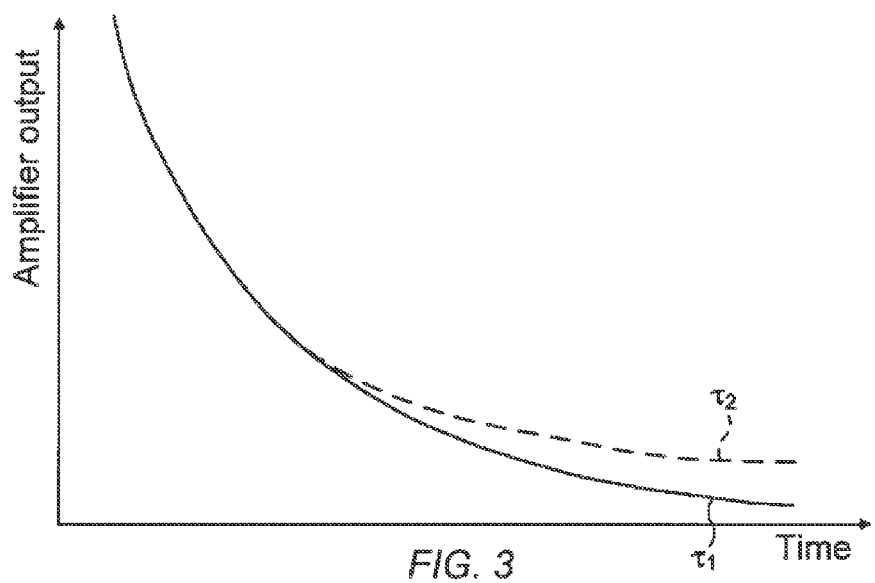
FIG. 3 shows an example prior art transimpedance amplifier response.
Figure 4:
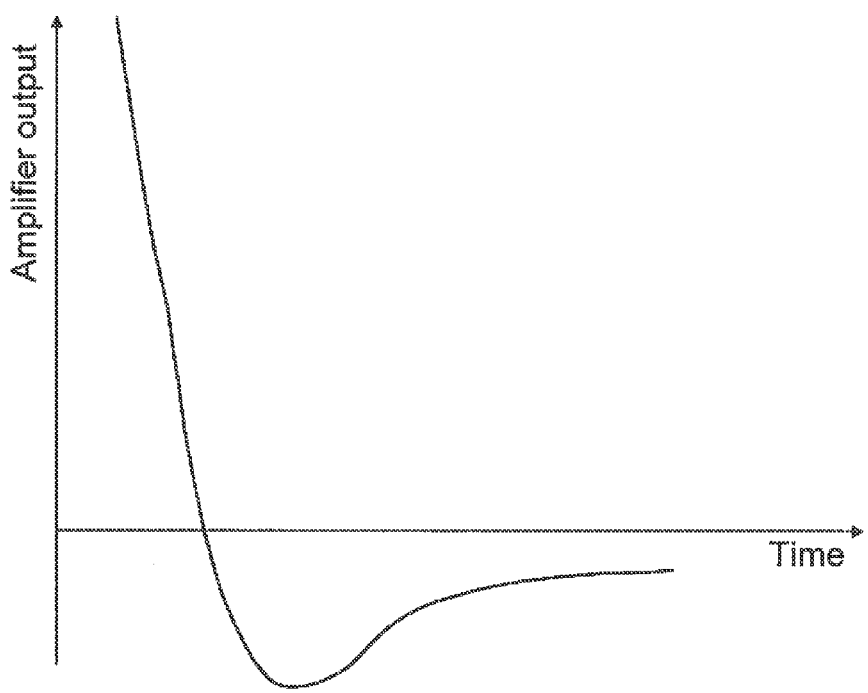
FIG. 4 shows a further example prior art transimpedance amplifier response.

In particular, it is possible to optimise the compensation of axial and dielectric absorption, to minimise the effect of the second time constant, $\tau_2$, described in the 'background' section above and shown in FIG. 3, thereby minimising settling time for the output $V_{OUT}$ of the amplifier. Thus, by setting up the non-linear electric field along the length of the feedback resistor $R_F$, the transimpedance amplifier 500 may achieve a short settling time on a high $V_{OUT}$ measurement for a step increase in input current $I_{IN}$, and a short return time to a precise zero output when the input current $I_{IN}$ is turned off. Such performance may be particularly beneficial in a number of different applications, for example, in isotope-ratio mass spectrometry, where the transimpedance amplifier 500 must respond accurately to signals with a high dynamic range and handle both a fast fade-out of a first signal and a precise measurement of a relatively weak second current signal.

The length of the cylinders C1, C2 and C3 may be determined as a function of the outer circumference of the feedback resistor $R_F$. The cylinders are primarily intended to compensate for longitudinal variability in the feedback resistor $R_F$, thus the arcuate capacitance of the feedback resistor $R_F$ may effectively be assumed to be constant around the feedback resistor $R_F$. Given this assumption, there is little benefit in setting the length of each of cylinders C1, C2 and C3 to be very much less than half of the circumference of the feedback resistor $R_F$. Cylinder lengths significantly shorter than this would result in a higher resolution of compensation in the longitudinal direction than on the circumference of the feedback resistor $R_F$, which is not worthwhile.

For example, the circumference of the feedback resistor may be 18 mm and the length of each of the cylinders may be between about 8 mm-13 mm, for example 11 mm. The resistor may be of any length, for example it may be between 35-40 mm, such as 37 mm. If the resistor is very long, more than three cylinders may be used and if it is very short, only two cylinders may be used (as suggested below).

Theoretically, the optimal diameter of the cylinders should be as large as possible, as this will give a smoother field variation on the surface of the feedback resistor $R_F$, and should minimise the effect of mounting errors in the fitting of the cylinders C1, C2 and C3. Furthermore, small diameter cylinders C1, C2 and C3 may make the transimpedance amplifier 500 difficult to adjust during configuration. However, a very large diameter would require a very large voltage to be applied to each of the cylinders C1, C2 and C3, which could be problematic when tapping the voltages from the output of the transimpedance amplifier 500. Therefore, the actual diameter of the cylinders may be chosen depending on the output voltage level that the transimpedance amplifier 200 is expected to generate (which may depend on the particular application of the transimpedance amplifier 500). Typically, it has been found that an inner cylinder diameter that is approximately twice the outer diameter of the feedback resistor RF may be effective. For example, the feedback resistor may have an outer diameter of 5.5 mm, and the cylinders C1, C2 and C3 may each have a diameter of 9-13 mm, for example 11 mm.

Configuration of the transimpedance amplifier 500 may take place before it is used to perform current measurements. For isotope-ratio mass spectrometry applications, in consideration of the need precisely to measure a relatively weak current signal, the main figure of merit during configuration is the avoidance of overshoot and undershoot of the output voltage $V_{PIT}$ after a step increase or decrease in the input current $I_{IN}$, even though this may result in a slightly longer time constant for the overall rise and fall of the signal $V_{PIT}$ for the transimpedance amplifier 500. Therefore, configuration of the transimpedance amplifier 500 may focus predominantly on the compensation of axial and radial dielectric absorption in order to minimise the second time constant, $\tau_2$.

A switchable test current of, for example, 1 pA may be applied as the input current $I_{IN}$ to the transimpedance amplifier 500, such that the input current $I_{IN}$ may switch from 0 pA to 1 pA and vice versa. Initially, the voltage applied to cylinder C1, which is the cylinder closest to the inverting terminal of the operational amplifier IC1, may be adjusted using the variable resistor R3. The cylinder C1 dominates the capacitive feedback and determines a fraction of the time constant for the entire circuit. The range of R3 may, for example, be configured to be a proportion of the output voltage $V_{OUT}$ in the range of about 0.05 to 0.15 times the output voltage $V_{OUT}$ and can give a time constant of about 0.5 to 1.5 seconds (equalling a bandwidth of 0.32 to 0.11 Hz).

The voltage initially applied to cylinder C2, which is the second closest cylinder to the inverting terminal of the operational amplifier IC1, may, for example, initially be set to 0.5 times the output voltage $V_{OUT}$. Adjustment of the proportion of the output voltage $V_{OUT}$ that is applied to cylinder C2 may then be performed using the variable resistor R6, which may be configured to enable the application of a voltage that is a proportion of the output voltage $V_{OUT}$ in the range of about 0.4 to 0.6 times the output voltage $V_{OUT}$. Adjustment of the voltage applied to cylinder C2 has a minor influence on the time constant of the entire circuit and may be altered for optimisation of zero undershoot and overshoot of the output voltage $V_{OUT}$. Consequently, for isotope-ratio mass spectrometry applications, adjustment of the voltage applied to cylinder C2 may be the most important adjustment to be made in configuring the transimpedance amplifier 500.

Adjustment of the proportion of the output voltage $V_{OUT}$ that is applied to cylinder C3, which is the cylinder closest to the output of the operational amplifier IC1, may then be performed by adjusting the variable resistor R1, which may be configured to enable application of a voltage that is a proposition of the output voltage $V_{OUT}$ in, for example, the range of about 0.6 to 1 times the output voltage $V_{OUT}$. This proportion of the output voltage $V_{OUT}$ may be varied in order to optimize any residual overshoot or undershoot of the output voltage $V_{OUT}$ and to boost the rise time of a current step in $I_{IN}$.

If the transimpedance amplifier 500 is not achieving a sufficiently fast, distortion free settling time (for example, in isotope-ratio mass spectrometry, a settling time of less than about six seconds, for example 6.5 seconds, or 6 seconds, or 5 seconds, or 4.5 may be desirable) further experimental adjustment of the proportion of the output voltage $V_{OUT}$ that is applied to cylinder C2 may be made.

Adjustment of the voltages applied to the cylinders C1, C2 and C3 may be made iteratively. For example, the voltage applied to cylinder C1 may be iteratively adjusted, with the performance of the transimpedance amplifier 500 measured after each adjustment. The same process may be undertaken for cylinder C2 and/or C3. After a voltage has been set for at least two of the cylinders C1, C2 and C3, further adjustment may be made to the voltage applied to at least one of the cylinders for whom a voltage had previously been set. For example, iterative repetition of the voltage adjustment to cylinders C1, C2 and C3 may take place until a desired transimpedance amplifier 500 performance is achieved.

Because the axial and radial parasitic capacitances and axial and radial dielectric absorption of the feedback resistor $R_F$ are all nonlinear with position along the length of the feedback resistor $R_F$, the differences between the voltages applied to each adjacent cylinder will also vary along the length of the feedback resistor $R_F$. That is to say, the difference between $V_{OUT}$ and $V_3$ (the voltage applied to C3) will not be the same as the difference between $V_3$ and $V_2$ (the voltage applied to C2) and/or the difference between $V_3$ and $V_2$ will not be the same as the difference between $V_2$ and $V_1$ (the voltage applied to C1) and/or the difference between $V_2$ and $V_1$ will not be the same as the difference between $V_1$ and the voltage at the input terminal of the operational amplifier IC1. Thus, the distribution of voltages applied along the length of the feedback resistor $R_F$ is non-linear. The non-linearity of voltage distribution corresponds with the non-linearities of the feedback resistor $R_F$ in that the distribution of voltages is arranged to compensate for the non-linearities of the feedback resistor $R_F$.

After optimization of the voltages applied to the cylinders C1, C2 and C3 of the feedback resistor $R_F$, the orientation of the feedback resistor $R_F$ may not be reversed, due to the individual nature of ultrahigh value resistors and their large spatial nonlinearities.

Having configured the transimpedance amplifier 500, the transimpedance amplifier 500 may be housed within a vacuum chamber before it is used to measure very small input currents. Housing the transimpedance amplifier 500 within a vacuum chamber protects it from humidity and the consequent a-decay, which may negatively influence the accuracy of the transimpedance amplifier's measurements.

After the transimpedance amplifier 500 has been housed within the vacuum chamber, it may no longer be possible to adjust any of resistors R1, R3 and R6. However, deviations from the optimal adjustment of the resistors R1, R3 and R6 may take place during installation of the transimpedance amplifier 500 into the vacuum chamber, and/or due to temperature changes over time and/or component aging. If adjustments are required after installation of the transimpedance 500 amplifier into the vacuum chamber, a compensating voltage Vx may be applied from outside the vacuum chamber in order to alter the voltage applied to the second cylinder C2. The voltage applied at Vx might be a fraction of the output voltage $V_{OUT}$, for example it may be between 0 to 0.2 times $V_{OUT}$. The ability to adjust the voltage applied to the second cylinder C2 may be particularly useful in isotope-ratio mass spectrometry applications where optimisation of zero undershoot and overshoot is important.

Figure 7:
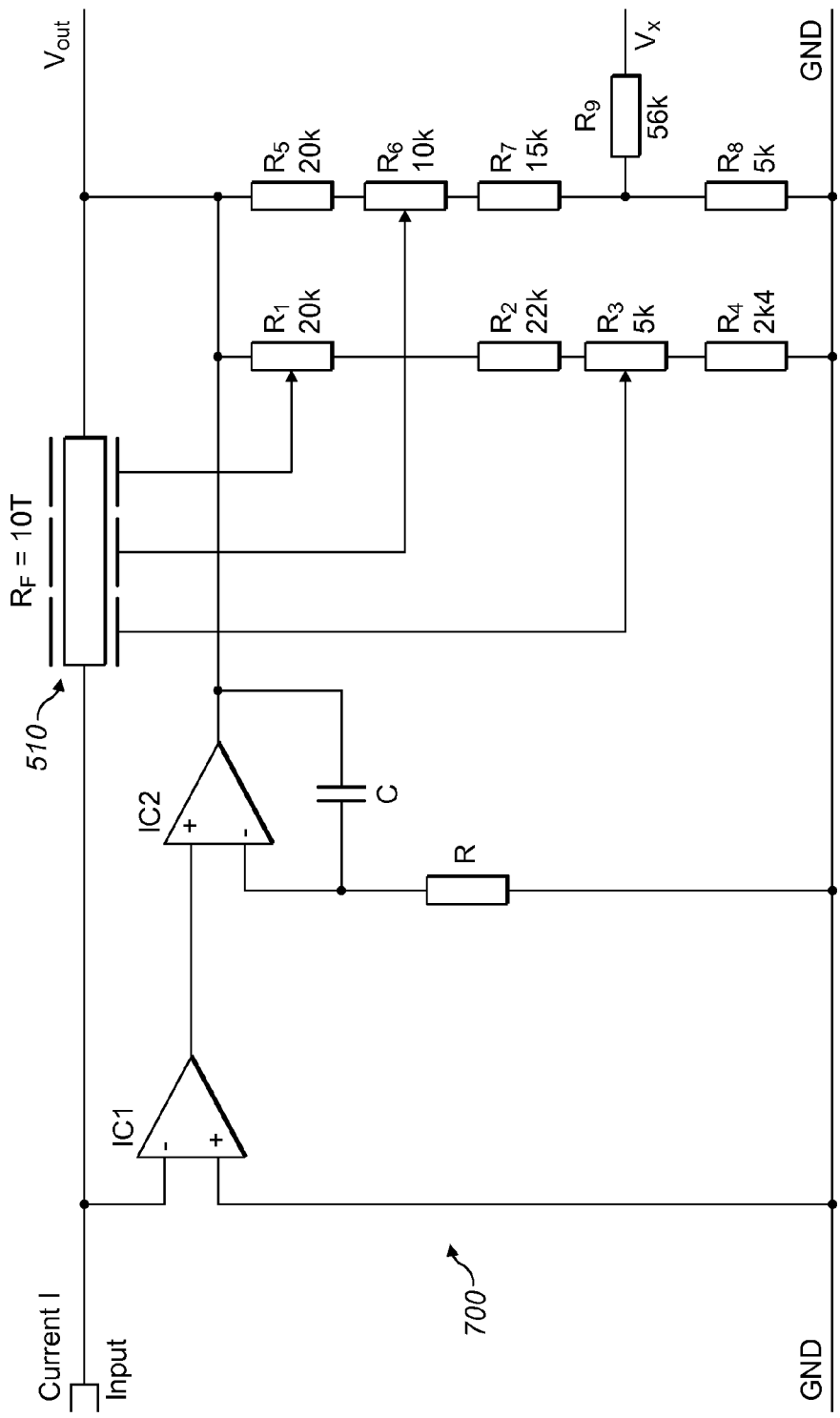
FIG. 7 shows a further transimpedance amplifier with the ultrahigh value feedback resistor assembly in accordance with the present disclosure.

FIG. 7 shows a further transimpedance amplifier 700 that utilizes the above described resistor assembly 510 comprising an ultrahigh value feedback resistor $R_F$. It should be noted that the component values shown in FIG. 7 are example values only and that other component values may be used. The transimpedance amplifier 700 is very similar to the transimpedance amplifier 500, but includes a further operational amplifier IC2. The further operational amplifier IC2 may be operated at a relatively high voltage, for example +/−15V, in order further to amplify the signal output from operational amplifier IC1 when operational amplifier IC1 is operated at a relatively low voltage, for example +/−1 to 2V, in order to minimize the bias current of operational amplifier IC1. The further operational amplifier IC2 is arranged with resistor R10 and capacitor C1 so that it operates as a non-inverting integrator to suppress oscillation behavior that may occur as a consequence of operating the further operational amplifier IC2 at relatively high voltages. The integrator circuit acts like a low-pass filter and lowers the gain for high-frequencies, whilst avoiding oscillation and maintaining DC gain.

Figure 8:
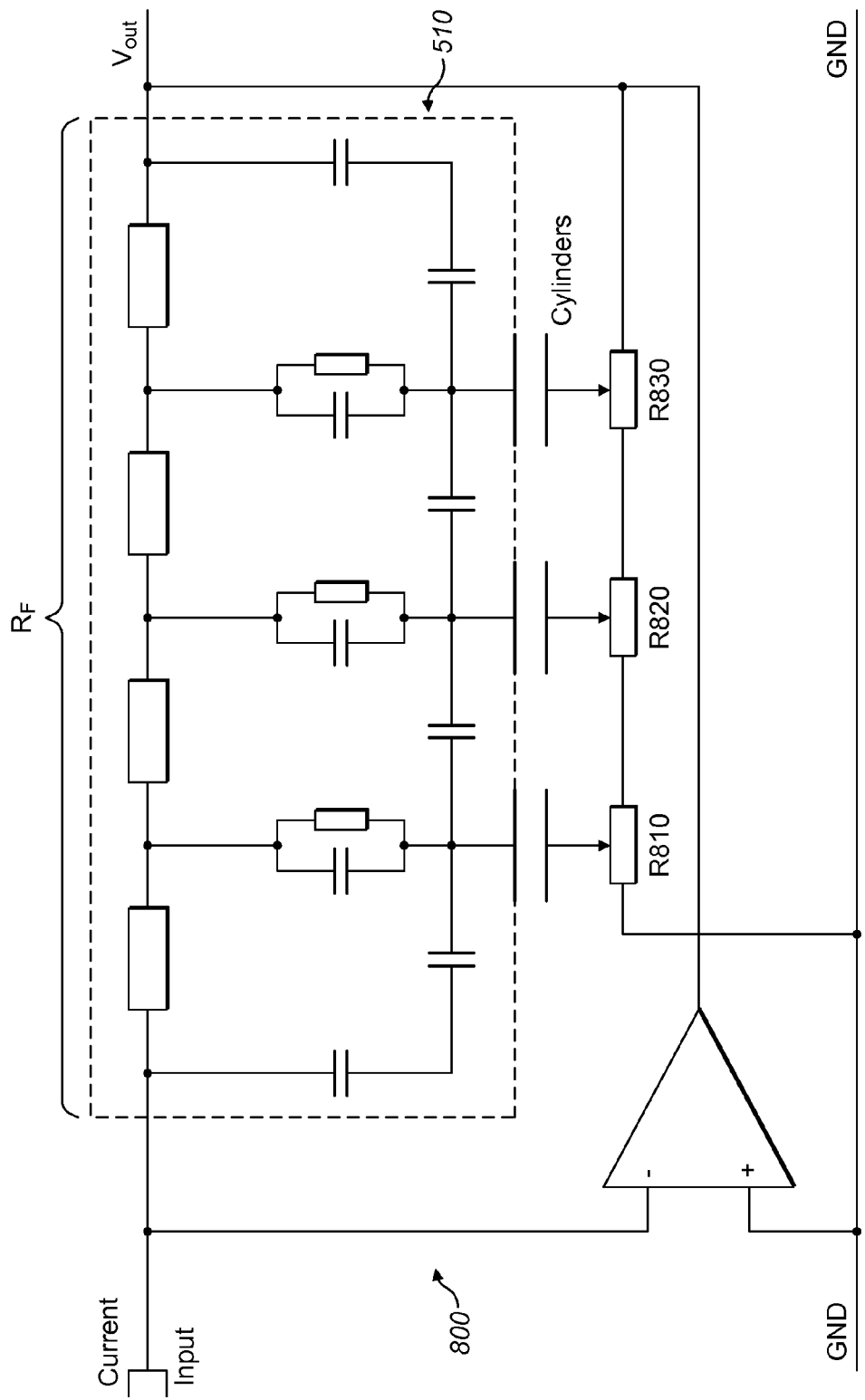
FIG. 8 shows an RC-mesh model for the ultrahigh value feedback resistor assembly of the present disclosure when used in a transimpedance amplifier circuit.

FIG. 8 shows a further transimpedance amplifier 800 that utilizes the above described resistor assembly 510 comprising an ultrahigh value feedback resistor $R_F$. The transimpedance amplifier 800 is a simplified version of the transimpedance amplifier 200 and includes a simplified RC-mesh network model for the feedback resistor $R_F$. The voltage divider at the output of the transimpedance amplifier 800 is a simplified voltage divider and comprises three variable resistors R810, R820 and R830, which are configured for adjustment of the voltages applied to the cylinders C1, C2 and C3 of the feedback resistor $R_F$.

Figure 9:
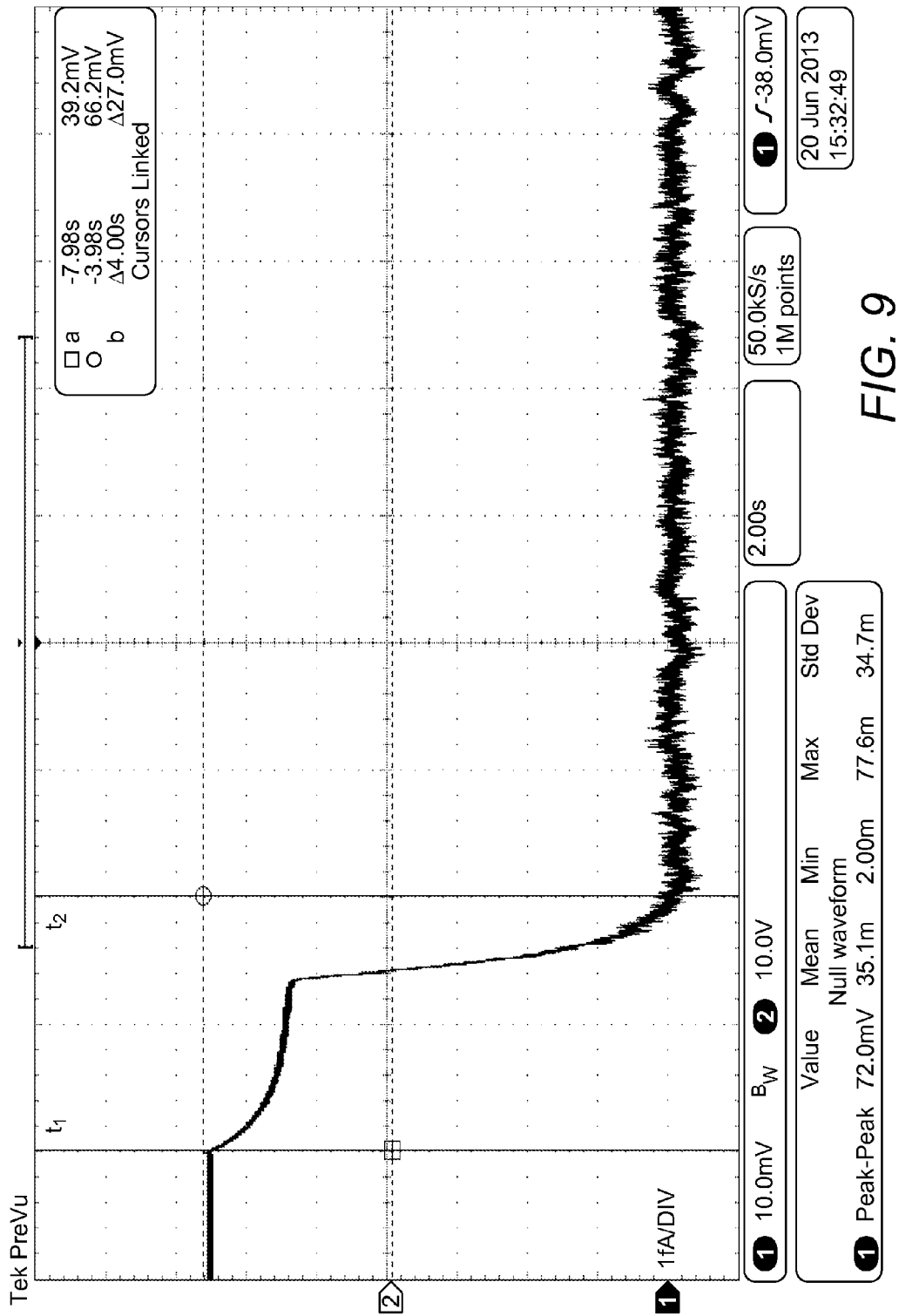
FIG. 9 shows the output voltage response of a transimpedance amplifier comprising the ultrahigh value feedback resistor assembly of the present disclosure when a current of 1 pA applied to the input of the transimpedance amplifier is turned off.

FIG. 9 shows a plot of output voltage $V_{OUT}$ decay over time for a transimpedance amplifier that uses the feedback resistor $R_F$ described above. Time is represented at a scale of 2 seconds/DIV (division) on the x-axis and output voltage $V_{OUT}$ is represented at a scale of 1 fA/DIV on the y-axis (although the y-axis is electronically compressed above the $5^{th}$ division from the baseline so that the entire current signal can fit vertically on the plot). The input current $I_{IN}$ is initially 1 pA and at time $t_1$ the signal is switched off. At time $t_2$, approximately four seconds after the input signal is switched off, output voltage $V_{OUT}$ has decayed almost to zero (i.e. baseline) without any undershoot or overshoot. A voltage decay within this time period and without any undershoot or overshoot is desirable in a number of different applications, for example in isotope-ratio mass spectrometry where a second signal that quickly follows a first signal must be measured to high precision, and may be made possible by configuring the feedback resistor $R_F$ correctly.

It should be noted that FIG. 9 shows two decay periods between $t_1$ and $t_2$. The first, gentle, decay from $t_1$ is caused by the circuit that is used to measure the signal. The end of the first decay and the start of the second, 'edge' decay, is where the effect of the 'limiter' of the measuring electronics ends.

Figure 10:
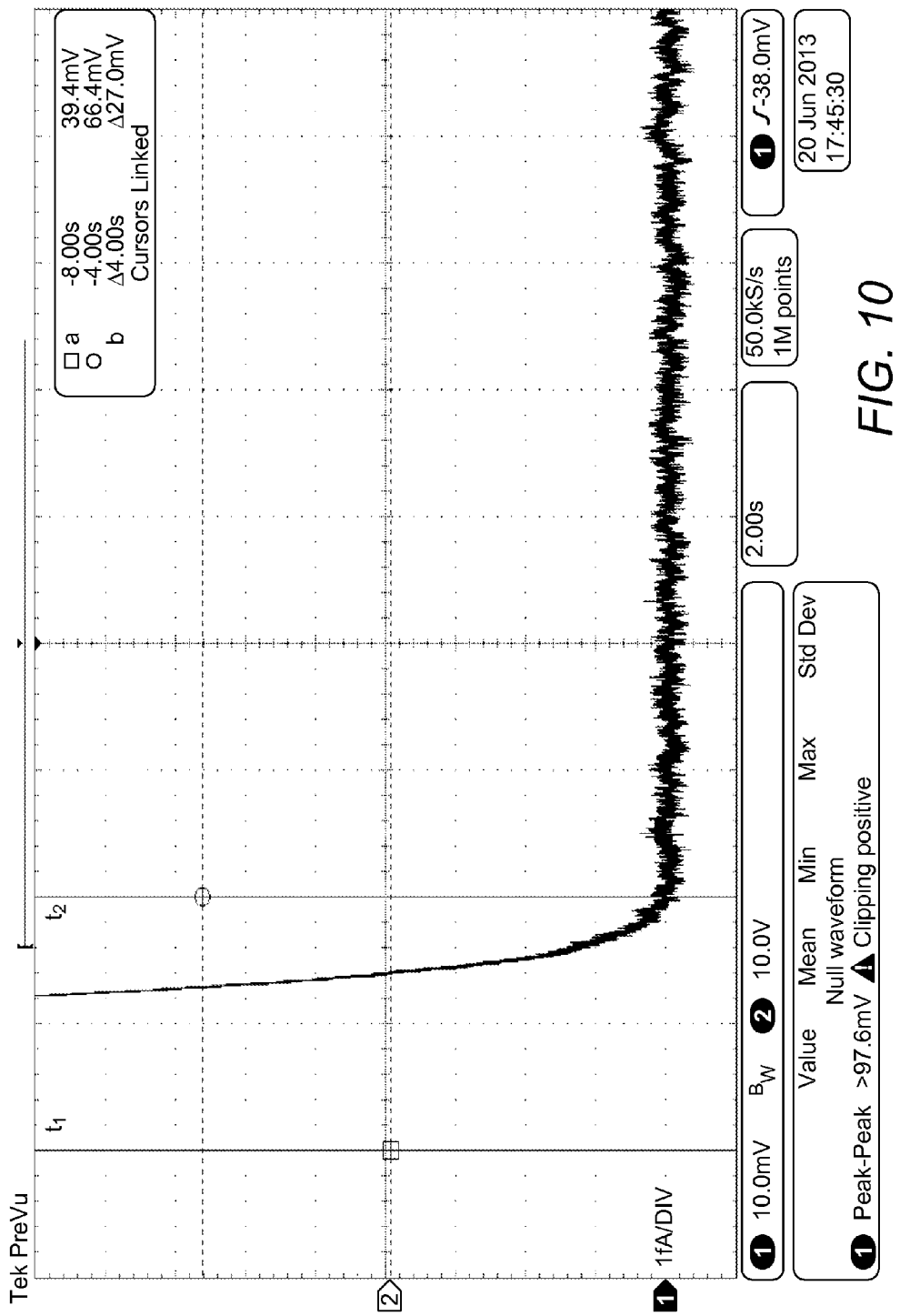
FIG. 10 shows a close-up of the output voltage response of FIG. 9.

FIG. 10 shows a close-up view of the plot of FIG. 9, demonstrating the output voltage $V_{OUT}$ decay to the baseline without any undershoot or overshoot. The scale of the x-axis and y-axis is the same as for FIG. 9. Again, at time $t_1$, a 1 pA signal at the input to the transimpedance amplifier is switched off and at time $t_2$, which is approximately four seconds after $t_1$, the output voltage $V_{OUT}$ has decayed to the baseline without undershoot or overshoot.

Figure 11:
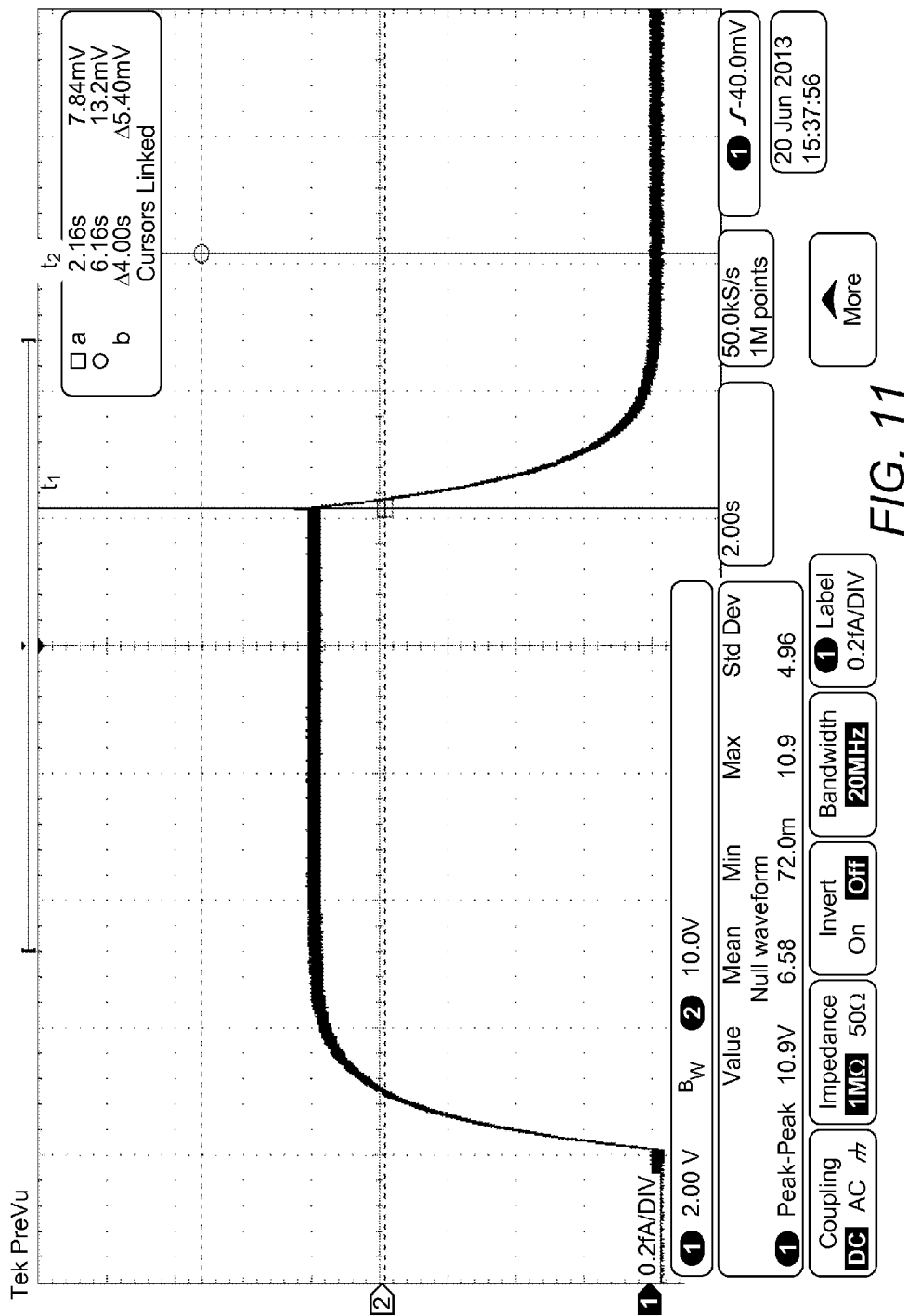
FIG. 11 shows the output voltage response of a transimpedance amplifier comprising the ultrahigh value feedback resistor assembly of the present disclosure when a current of 1 pA is applied to the input of the transimpedance amplifier and then turned off.

FIG. 11 shows a plot of output voltage $V_{OUT}$ over time for a transimpedance amplifier that uses the resistor assembly 510 comprising a feedback resistor $R_F$ described above. Time is represented at a scale of 2 seconds/DIV on the x-axis and output voltage $V_{OUT}$ is represented at a scale of 2 pA/DIV on the y-axis. Initially, the input current $I_{IN}$ is switched from 0 A to 1 pA, causing a rise in $V_{OUT}$. At time $t_1$, the input current $I_{IN}$ signal is switched off, causing the output voltage $V_{OUT}$ to decay almost to zero (i.e. baseline). The output voltage $V_{OUT}$ reaches its baseline value at time $t_2$, which is approximately four seconds after $t_1$, without any undershoot or overshoot, as explained above.

Figure 12:
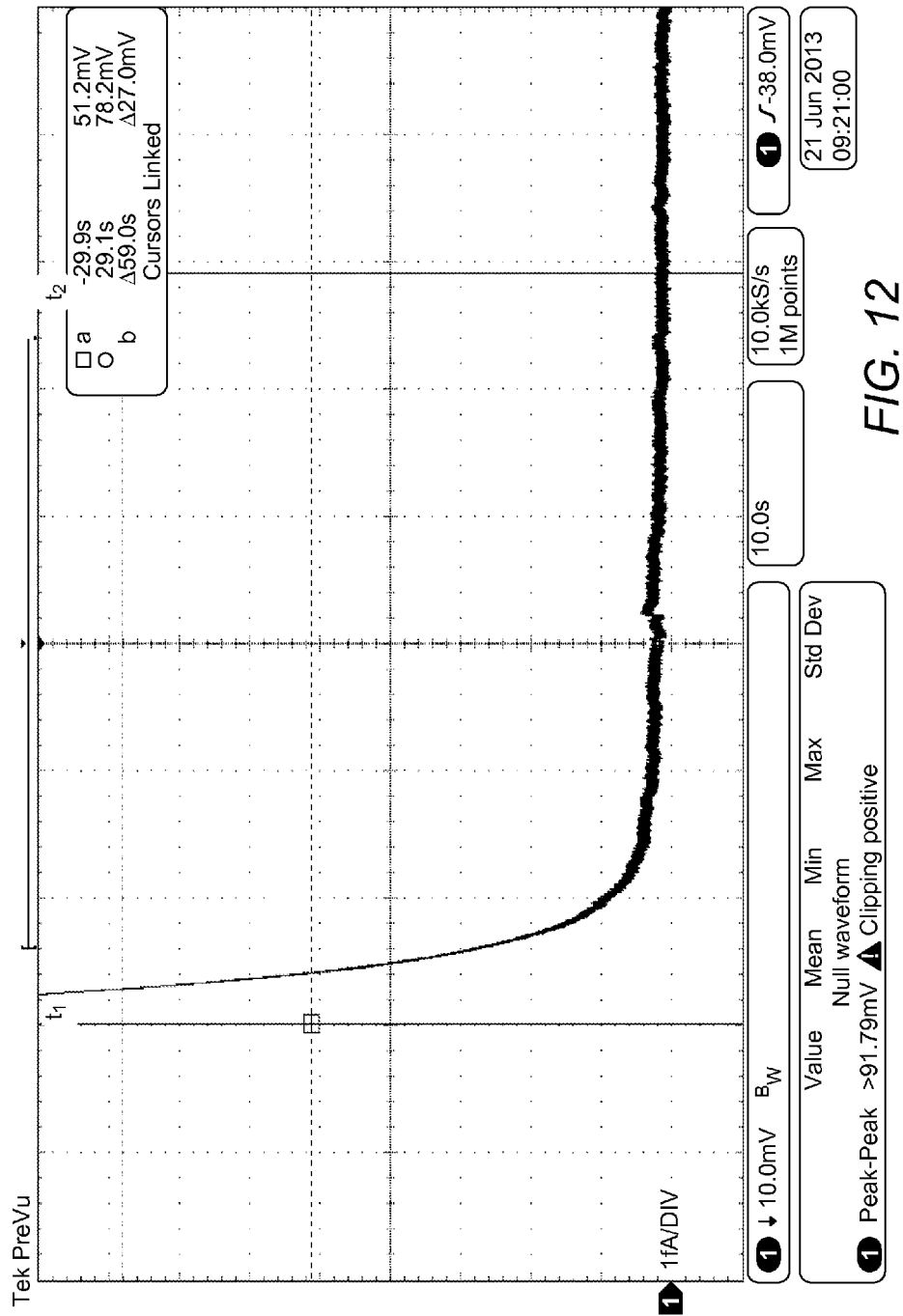
FIG. 12 shows a close-up output voltage response of a prior art transimpedance amplifier when a current of 1 pA applied to the input of the transimpedance amplifier is turned off.

FIG. 12 shows an example plot of the output voltage $V_{OUT}$ of a transimpedance amplifier that uses just an ultrahigh value feedback resistor and does not use the resistor assembly 510 described above. Therefore, no cancelation of dielectric absorption in the ultrahigh value feedback resistor is provided. Time is represented at a scale of 10 seconds/DIV on the x-axis and output voltage $V_{OUT}$ is represented at a scale of 1 fA/DIV on the y-axis. Initially, the input current $I_{IN}$ is equal to 1 pA and at time $t_3$, the input current is switched off. About four seconds after $t_3$, residual output voltage is still present, and even ten seconds after $t_3$, the output voltage is still about 10 mV. For isotope-ratio mass spectrometry applications, this is unacceptable as small signals caused by isotopes will be masked by $V_{OUT}$ not having decayed to zero before the second small current signal needs to be measured. Only at time $t_4$ has the output voltage decayed to the baseline value, which is more than 50 seconds after $t_1$. For this reason, prior art methods have limited the value of feedback resistors which can practically be used for isotope-ratio mass spectrometry to $10^{11}$ Ohms. In contrast the present invention allows the practical use of feedback resistors as high as 10 TΩ or higher, providing a much-needed increase in sensitivity of the detection system and a reduction in the signal to noise ratio which improves precision of measurement.

Thus, the decay-time and overshoot/undershoot advantages of using the resistor assembly 510 in transimpedance amplifiers, particularly when used for isotope-ratio mass spectrometry, are readily apparent.

Various alternatives to the above described aspects of the present disclosure may be appreciated by one with ordinary skilled in the art.

For example, rather than constructing the feedback resistor $R_F$ by coiling a high impedance resistive coating around a ceramic cylinder (or glass cylinder or any other insulative material) and coating that with a sealed lacquer coating, the feedback resistor $R_F$ may be constructed in any size and shape using any materials suitable for forming an ultrahigh value resistor. In one example, the feedback resistor $R_F$ may not be provided with a sealed lacquer coating at all. Instead, the resistive element may be surrounded with any type of insulative material, for example air or a vacuum. The cylinders C1, C2 and C3 may likewise be made from any conducting material and to any size or shape that is suitable for establishing the above described compensation electric fields. For example, they may be conductive compensation elements C1, C2 and C3 having a substantially square cross-section, a substantially rectangular cross-section, a substantially triangular cross-section, a substantially oval cross section etc.

Furthermore, the compensation elements C1, C2 and C3 may not be arranged to surround the feedback resistor, $R_F$, fully, but instead to partially surround the feedback resistor, $R_F$. For example, the cylinders C1, C2 and C3 may have a shape that would not fully enclose the feedback resistor $R_F$, such as a 'C' or a 'U' shape.

Furthermore, rather than using three cylinders C1, C2 and C3, any number of conductive cylinders from two upwards may be arranged to surround the resistor so as to correct for the nonlinear variations along the length of the elements that make up the resistor. For example, the resistor assembly 510 may be provided with two, three, four or more conductive cylinders, each one electrically isolated from the others such that a different voltage may be applied to each in order to establish different compensating external electric fields along the length of the feedback resistor $R_F$.

When the feedback resistor $R_F$ does comprise a lacquer coating, it may be formed to any thickness that is suitable for protecting the high impedance resistive coating from mechanical and/or chemical interference.

The conductive cylinders C1, C2 and C3 may all have the same radial size, or one or more of the conductive cylinders may have a different radial size to the other conductive cylinders. Where at least one of the conductive cylinders has a radial size different to that of the other conductive cylinders, it may, or may not, be formed to overlap at least partially at least one of the other conductive cylinders in the radial direction. For example, there may be two conductive cylinders, wherein a first, shorter cylinder is located near the centre of the feedback resistor $R_F$, and a second, longer resistive cylinder with a larger radius is arranged to overlap the first cylinder so that the longitudinal centres of the first and second cylinders occupy the same position or similar positions on the longitudinal length of the feedback resistor $R_F$. A first voltage may be applied to the first cylinder, a "high" voltage may be applied to one end of the second cylinder and a "low" voltage (for example, ground) applied to the other end of the second cylinder.

The conductive cylinders C1, C2 and C3 together may surround the resistor along its entire longitudinal length, or along only part of its length.

At least one of the conductive cylinders C1, C2 and C3 may preferably expose a conductive surface towards the feedback resistor RF. However, at least one of the conductive cylinders C1, C2 and C3 may alternatively comprise at least one other surface between the conductive material of the cylinder and the feedback resistor $R_F$. For example, the conductive material of one or more of the cylinders C1, C2 and C3 may be "buried", wherein an insulating material is formed to cover, at least partially, the conductive material.

When the feedback resistor $R_F$ is used in a transimpedance amplifier, like those shown in FIGS. 5, 7 and 8 of the present disclosure, voltages may be derived from the amplifier output voltage and applied to the conductive cylinders C1, C2 and C3 by any means. The voltages applied to the conductive cylinders C1, C2 and C3 are applied from a voltage source. The voltage source may comprise one or more voltage dividers such that the voltages applied to each of the conductive cylinders C1, C2 and C3 are derived from the amplifier output voltage $V_{OUT}$ by the one or more voltage dividers (as shown in FIGS. 5, 7 and 8). Thus, the one or more voltage dividers may be considered to be a voltage source for one or more conductive cylinders C1, C2, C3.

Additionally, or alternatively, the voltage source may comprise any other components for deriving and applying the voltages to the conductive cylinders C1, C2 and C3. For example, the voltage source may comprise a digital circuit configured to read the output voltage of the amplifier (for example, by digitising the output voltage) and set at least one of the voltages applied to the conductive cylinders C1, C2 and C3 as a function of the reading. In this implementation, the digital circuit may further comprise a voltage dependant resistor that is adjusted by an amount determined from the reading of the output voltage in order to set at least one of the voltages applied to the conductive cylinders C1, C2 and C3. In addition, or as an alternative, to the voltage dependent resistor, the digital circuit may comprise at least one amplifier, transistor and/or a voltage regulator, wherein an input to the amplifier, transistor and/or voltage regulator is adjusted by an amount determined from the reading of the output voltage in order to set the voltage applied to at least one of the conductive cylinders C1, C2 and C3. In addition, or as an alternative, to the use of a voltage dependent resistor, amplifier, transistor and/or voltage regulator, the digital circuit may comprise an analogue to digital converter (ADC) for reading the output of the amplifier and a digital to analogue converter (DAC) for controlling the voltage applied to at least one of the cylinders C1, C2 and C3 by the voltage source.

The voltage source may optionally comprise at least one potential divider for applying a voltage to at least one of the conductive cylinders C1, C2 and C3 and at least one of the digital circuit arrangement described above for applying a voltage to at least one of the other conductive cylinders C1, C2 and C3.

Furthermore, where the voltage source comprises at least one voltage divider for applying a voltage to at least one of the conductive cylinders C1, C2 and C3, it may comprise any number of resistors at any value suitable to apply a desired voltage to each of the conductive cylinders C1, C2 and C3. Furthermore, rather than using two voltage dividers, as shown in FIG. 7, any number of voltage dividers may be used, for example there may be a single voltage divider from which the voltages for at least one of the conductive cylinders C1, C2 and C3 is obtained, or there may be three voltages dividers, one for each of the conductive cylinders C1, C2 and C3. There may also be more than three voltage dividers, for example when $R_F$ has more than three conductive cylinders.

The voltage divider(s) may be designed not to comprise any variable resistors. In this case, the voltages applied to each of the conductive cylinders C1, C2 and C3 may be varied by application of an external voltage(s) to a point on the voltage divider(s) (such as voltage Vx in FIGS. 5 and 7). Where the voltage source comprises at least one of the digital circuit arrangements described above, the proportion of $V_{OUT}$ that is applied to at least one conductive cylinder C1, C2 and C3 by the digital circuit may be adjusted through use of an adjustment input. The adjustment input may comprise a voltage bias for the digital circuit which may change the operating point of the ADC and/or the DAC and/or the voltage applied to the voltage dependent resistor and/or the voltage applied to the transistor and/or the voltage applied to the amplifier and/or the voltage applied to the voltage regulator. Additionally, or alternatively, the adjustment input may comprise a programming interface configured to adjust the operation of the digital circuit. In this way, the voltage applied to at least one of the cylinders C1, C2 and C3 may be an adjustable proportion of the output voltage of the amplifier (for example, for a given output voltage of the amplifier, the voltage applied to at least one of the cylinders C1, C2 and C3 may be increased or decreased, such as changing it from $0.7V_{OUT}$ to $0.8V_{OUT}$).

The transimpedance amplifier may be configured such that voltage Vx affects the proportion of $V_{OUT}$ that is applied to any one or more of the conductive cylinders C1, C2 and C3. The transimpedance amplifier may be configured to have more than one terminal for application of external voltage to the voltage divider(s) (i.e. more than one Vx) such that the voltage applied to more than one conductive cylinder C1, C2 and C3 may be varied independently from the other voltages applied to the conductive cylinders C1, C2 and C3. Alternatively, the transimpedance amplifier may be configured not to have a terminal for external voltage application to the voltage divider(s) (i.e., Vx may be omitted).

A transimpedance amplifier using the feedback resistor $R_F$ is not limited only to the arrangements and components shown in FIGS. 5, 7 and 8, but may comprise any components suitable for establishment of a transimpedance amplifier. For example, rather than using one or more operational amplifiers in the transimpedance amplifier, any suitable amplifier may be used. Furthermore, the transimpedance amplifier may have only a single amplification stage or a plurality of amplification stages. Furthermore, the transimpedance amplifier may also comprise additional elements, for example a filter(s) and/or integrator(s) etc, which may either be formed as part of an amplification stage, or any other stage, of the transimpedance amplifier, or as a separate functional stage.

Configuration of the voltages applied to the conductive cylinders C1, C2 and C3 may be carried out in any order and using any process suitable for achieving desired performance results.

The voltages applied to the cylinders C1, C2 and C3 may be of any size suitable for achieving a desired performance of the transimpedance amplifier. For example, whilst the above described aspects disclose ranges of fractions of the output voltage $V_{OUT}$ (for example, 0.4 to 0.6 times $V_{OUT}$)

that the voltage applied to at least one of the cylinders C1, C2 and C3 may fall into, these are merely by way of example only. Any absolute voltage value or fraction of $V_{OUT}$ may be applied to any one or more of cylinders C1, C2 and C3 as the skilled person sees fit in order to achieve a desired transimpedance amplifier performance, provided that the magnitudes of the voltages are distributed non-linearly along the length of the feedback resistor RF in order to compensate for the non-linearities of the feedback resistor RF, as explained earlier.

Furthermore, rather than housing the transimpedance amplifier within a vacuum chamber, the transimpedance amplifier may be operated without a vacuum chamber.

In one alternative arrangement, the resistor assembly may comprise two or more resistors that are coupled together (for example, in series) to perform the function of the feedback resistor $R_F$. It will be appreciated that each of the two or more resistors will have the non-linearities described earlier and, as such, each of the resistors would be provided with two or more conductive cylinders C1, C2 etc that will have voltages applied to them as described above in order to compensate for the non-linearities of each of the resistors. Thus, whilst the two or more resistors are coupled together in order together to perform the function of a feedback resistor, in such an arrangement each of the resistors should be treated as a feedback resistor $R_F$ in its own right in order to compensate for the non-linearities of each of the resistors in the manner described above.

The invention claimed is:

1. A transimpedance amplifier comprising:
   a resistor assembly coupled between an output of the transimpedance amplifier and an input of the transimpedance amplifier, the resistor assembly comprising:
      a resistor having a longitudinal length, the resistor comprising:
         a resistive element; and
         an insulator surrounding the resistive element; and
      a plurality of conductive compensation elements each at least partially surrounding the insulator along at least part of the longitudinal length of the resistor; and
   a voltage source for applying a first voltage to a first conductive compensation element of the plurality of conductive compensation elements and a second voltage to a second conductive compensation element of the plurality of conductive compensation elements, wherein:
      the first voltage and the second voltage are each derived from the output voltage, $V_{out}$, of the transimpedance amplifier, the first voltage being a first proportion of $V_{out}$ and the second voltage being a second proportion of $V_{out}$ and wherein the voltage source comprises:
         a voltage controller for adjusting at least one of the first proportion and/or the second proportion.

2. The transimpedance amplifier of claim 1, wherein the variable voltage source comprises:
   at least one voltage divider at the output of the transimpedance amplifier, wherein
   at least one of the first voltage and/or the second voltage is taken from the at least one voltage divider.

3. The transimpedance amplifier of claim 2, wherein the voltage controller comprises:
   at least one variable resistor arranged such that the at least one first proportion and/or second proportion is adjustable using the at least one variable resistor.

4. The transimpedance amplifier of claim 1, wherein the voltage controller comprises:
   an adjustment terminal configured such that at least one of the first proportion and/or the second proportion is adjustable by application of an adjustment voltage to the adjustment terminal.

5. The transimpedance amplifier of claim 1, wherein the voltage source comprises:
   a digital circuit configured to digitise the output of the transimpedance amplifier and set at least one of the first voltage and/or the second voltage as a function of the digitised output of the transimpedance amplifier.

6. The transimpedance amplifier of claim 5, wherein:
   the digital circuit comprises an adjustment input for adjusting at least one of the first proportion and/or the second proportion; and
   the voltage controller comprises the adjustment input of the digital circuit.

7. The method of claim 1, wherein the voltage controller is configured for adjusting the first proportion and the second proportion independently from each other.

8. The transimpedance amplifier of claim 1, wherein each of the plurality of conductive compensation elements are arranged to occupy different positions along the longitudinal length of the resistor.

9. The transimpedance amplifier of claim 1, wherein at least one of the plurality of conductive compensation elements fully surrounds the insulator along at least part of the longitudinal length of the resistor.

10. The transimpedance amplifier of claim 9, wherein each of the plurality of conductive compensation elements are tubular.

11. The transimpedance amplifier of claim 10, wherein each the plurality of conductive compensation elements have the same radial size.

12. The transimpedance amplifier of claim 10, wherein the inner diameter of at least one of the plurality of conductive compensation elements is substantially twice the outer diameter of the resistor.

13. The transimpedance amplifier of claim 1, wherein each of the plurality of conductive compensation elements are of the same length.

14. The transimpedance amplifier of claim 1, wherein the length of each of the plurality of conductive compensation elements is substantially equal to or greater than half the outer diameter of the resistor.

15. The transimpedance amplifier of claim 1, wherein the insulator is formed on the resistive element.

16. The transimpedance amplifier of claim 15, wherein the insulator surrounding the insulative element comprises a lacquer coating.

17. The transimpedance amplifier of claim 1, further comprising a vacuum enclosure surrounding at least the resistor assembly.

18. A mass spectrometer comprising the transimpedance amplifier of claim 1.

19. A method of configuring the transimpedance amplifier of claim 1, the method comprising:
   applying a step current to the input of the transimpedance amplifier; and
   setting at least one of the first voltage and/or the second voltage.

20. The method of claim 19, wherein the first voltage and/or the second voltage are set to minimise overshoot and undershoot of a voltage at the output of the transimpedance amplifier in response to the step current at the first input of the transimpedance amplifier.

21. The method of claim 19, further comprising:
setting at least one of the first voltage and/or the second voltage by adjusting the voltage controller.

22. The method of claim 19, wherein the first voltage is set to achieve a desired time constant for the transimpedance amplifier.

23. The method of claim 19, wherein
a third conductive compensation element of the plurality of conductive compensation elements is closer than the first and second conductive compensation elements to the output of the transimpedance amplifier; and
the second conductive compensation element is positioned between the first and third conductive compensation elements along the longitudinal length of the resistor;
the method further comprising the step of:
setting the second voltage applied to the second conductive compensation element to minimise overshoot and undershoot of a voltage at the output of the transimpedance amplifier in response to the step current at the first input of the transimpedance amplifier.

24. The method of claim 19, wherein the first and/or second voltages are set by iterative adjustment.

25. The method claim 23, further comprising a step of setting a third voltage applied to the third conductive compensation element to minimise overshoot and undershoot of a voltage at the output of the transimpedance amplifier in response to the step current at the input of the transimpedance amplifier and to boost a rise time of the step current at the input of the transimpedance amplifier.

26. The method of claim 25, wherein the third voltage is set by iterative adjustment.

27. The method of claim 19, wherein the voltage controller comprises an adjustment terminal configured such that at least one of the first voltage proportion and/or the second voltage proportion is adjustable by application of an adjustment voltage to the adjustment terminal, the method further comprising a step of:
adjusting a voltage applied to the adjustment terminal to alter at least one of the first voltage proportion and/or second voltage proportion applied to the conductive compensation elements.

28. A method of converting a current to a voltage using a transimpedance amplifier that comprises:
a resistor assembly coupled between an output of the transimpedance amplifier and an input of the transimpedance amplifier, the resistor assembly comprising:
a resistor having a longitudinal length, the resistor comprising:
a resistive element; and
an insulator surrounding the resistive element; and
a plurality of conductive compensation elements each at least partially surrounding the insulator along at least part of the longitudinal length of the resistor; and
a voltage source for applying a first voltage to a first conductive compensation element of the plurality of conductive compensation elements and a second voltage to a second conductive compensation element of the plurality of conductive compensation elements, wherein:
the first voltage and the second voltage are each derived from the output of the transimpedance amplifier,
the method comprising:
applying the current to be converted to the input of the transimpedance amplifier such that a corresponding voltage is output at the output of the transimpedance amplifier, and
applying the first voltage to the first conductive compensation element of the plurality of conductive compensation elements and the second voltage to a second conductive compensation element of the plurality of conductive compensation elements, wherein
the first voltage and/or the second voltage have a magnitude(s) set to minimise the overshoot and undershoot of the output of the transimpedance amplifier in response to a change in the input current.

29. A method for performing mass spectrometry comprising:
generating ions in an ion source;
separating the ions according to their mass-to-charge ratio in a mass analyser;
admitting the ions to a collector to generate an electrical current; and
converting the electrical current to a voltage according to the method of claim 28.

* * * * *